(12) United States Patent
Perruchot et al.

(10) Patent No.: US 8,445,978 B2
(45) Date of Patent: May 21, 2013

(54) ELECTROMECHANICAL TRANSDUCER DEVICE AND METHOD OF FORMING A ELECTROMECHANICAL TRANSDUCER DEVICE

(75) Inventors: Francois Perruchot, Grenoble (FR);
Emmanuel Defay, Voreppe (FR);
Patrice Rey, Saint Jean Moirans (FR);
Lianjun Liu, Chandler, AZ (US); Sergio Pacheco, Scottsdale, AZ (US)

(73) Assignees: Freescale Semiconductor, Inc., Austin, TX (US); Commissariat à l'Energie Atomique et aux Energies Alternatives (CEA), Paris (FR)

( * ) Notice: Subject to any disclaimer, the term of this patent is extended or adjusted under 35 U.S.C. 154(b) by 181 days.

(21) Appl. No.: 13/128,035

(22) PCT Filed: Nov. 25, 2009

(86) PCT No.: PCT/IB2009/056020
§ 371 (c)(1),
(2), (4) Date: May 6, 2011

(87) PCT Pub. No.: WO2010/061364
PCT Pub. Date: Jun. 3, 2010

(65) Prior Publication Data
US 2011/0233693 A1 Sep. 29, 2011

(30) Foreign Application Priority Data
Nov. 26, 2008 (WO) .................. PCT/IB2008/055652

(51) Int. Cl.
*G01P 15/08* (2006.01)

(52) U.S. Cl.
USPC ............. 257/417; 257/415; 257/419; 438/21; 438/52; 438/739; 438/745

(58) Field of Classification Search
None
See application file for complete search history.

(56) References Cited

U.S. PATENT DOCUMENTS 6,309,048 B1 * 10/2001 Silverbrook ................... 347/54
6,746,891 B2   6/2004 Cunningham et al.
(Continued)

FOREIGN PATENT DOCUMENTS

WO   2010/061363 A2   6/2010
WO   2011001293 A2   1/2011

OTHER PUBLICATIONS

Hsueh, C.H. et al, "Thermal Stresses in Elastic Multilayer Systems," Thin Solid Films, copyright 2002 Elsevier Science B.V.; vol. 418, issue 2; Oct. 2002; pp. 182-188.

(Continued)

*Primary Examiner* — Kyoung Lee

(57) ABSTRACT

A micro or nano electromechanical transducer device formed on a semiconductor substrate comprises a movable structure which is arranged to be movable in response to actuation of an actuating structure. The movable structure comprises a mechanical structure comprising at least one mechanical layer having a first thermal response characteristic and a first mechanical stress response characteristic, at least one layer of the actuating structure, the at least one layer having a second thermal response characteristic different to the first thermal response characteristic and a second mechanical stress response characteristic different to the first mechanical stress response characteristic, a first compensation layer having a third thermal response characteristic and a third mechanical stress characteristic, and a second compensation layer having a fourth thermal response characteristic and a fourth mechanical stress response characteristic. The first and second compensation layers are arranged to compensate a thermal effect produced by the different first and second thermal response characteristics of the mechanical structure and the at least one layer of the actuating structure such that movement of the movable structure is substantially independent of variations in temperature and to adjust a stress effect produced by the different first and second stress response characteristics of the mechanical structure and the at least one layer of the actuating structure such that the movable structure is deflected a predetermined amount relative to the substrate when the electromechanical transducer device is in an inactive state.

23 Claims, 9 Drawing Sheets

U.S. PATENT DOCUMENTS

| | | | |
|---|---|---|---|
| 2002/0043895 | A1 | 4/2002 | Richards et al. |
| 2003/0062332 | A1 | 4/2003 | Harris et al. |
| 2003/0227234 | A1 | 12/2003 | Namerikawa et al. |
| 2005/0116798 | A1 | 6/2005 | Bintoro et al. |
| 2005/0127792 | A1 | 6/2005 | Mehta |
| 2005/0275696 | A1 | 12/2005 | Miyazawa et al. |
| 2006/0204776 | A1 | 9/2006 | Chen et al. |
| 2007/0257766 | A1 | 11/2007 | Richards et al. |
| 2008/0002299 | A1 | 1/2008 | Thurn |
| 2008/0202239 | A1 | 8/2008 | Fazzio et al. |
| 2011/0221307 | A1 | 9/2011 | Liu et al. |
| 2012/0056308 | A1 | 3/2012 | Perruchot et al. |

OTHER PUBLICATIONS

Jiang, H. et al., "Fabrication of PZT Actuated Cantilevers on Silicon-on-Insulator Wafers for a RF Microswitch," Micromachining and Microfabrication Process Technology VIII; San Jose, CA, USA; 2003; pp. 165-173.

Pulskamp, J. et al., "Mitigation of Residual Film Stress Deformation in Multilayer Microelectromechanical Ssytems Cantilever," IEEE Journal of Vacuum Science & Technology B: Microelectronic and Nanometer Structures; vol. 21, issue 6; Nov. 2003; pp. 2482-2486.

International Search Report mailed May 18, 2010 for International Application No. PCT/IB2009/053235, 4 pages.

International Search Report mailed May 17, 2010 for International Application No. PCT/IB2009/056019, 3 pages.

Hong Zhu et al: "Membrane Microcantilever Array Fabrication with PZT Thin Films for Nanorange Movement" Microsystem Technologies; Micro and Nanosystems Information Storage and Processing Systems, Springer, Berlin, DE, vol. 11, No. 8-10, Aug. 1, 2005, pp. 1121-1126.

Hee-Chul Lee et al: "Design, Fabrication and RF Performances of Two Different Types of Piezoelectrically Actuated Ohmic MEMS Switches; Design, Fabrication and RF Performances of Two Different Types of Piezoelectrically Actuated Ohmic MEMS Switches" Journal of Micromechanics & Microengineering, Institute of Physics Publishing, Bristol, GB, vol. 15, No. 11, Nov. 1, 2005, pp. 2098-2104.

Pulskamp Jeffrey S et al: "Mitigation of Residual Film Stress Deformation in Multilayer Microeclectromechanical Systems Cantilever" IEEE, Journal of Vacuum Science & Technology B: Microelectronic and Nanometer Structures, vol. 21, Issue 6, Nov. 2003, p. 2482.

Hsueh C H: "Thermal Stresses in Elastic Multilayer Systems" Thin Solid Films, vol. 418, Issue 2, Oct. 2002, pp. 182-188, Copyright 2002 Elsevier Science B.V.

International Search Report and Written Opinion correlating to PCT/IB2009/056020 dated May 12, 2010.

\* cited by examiner

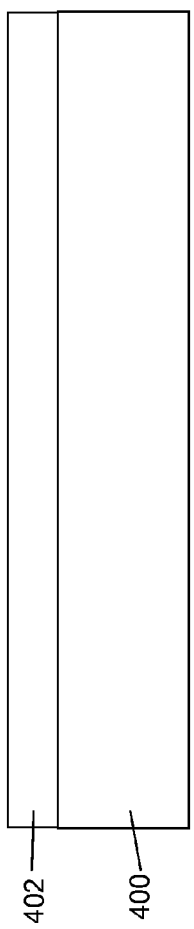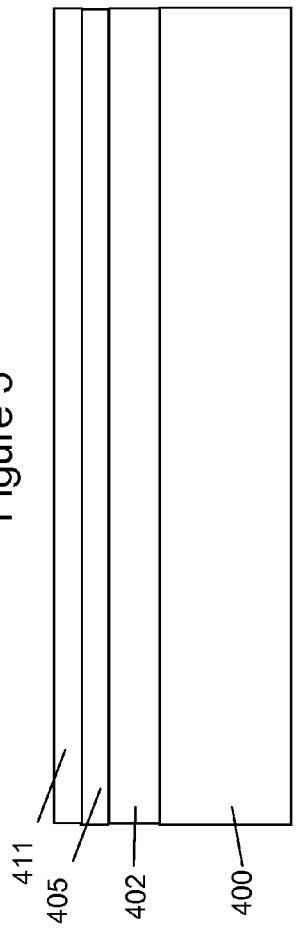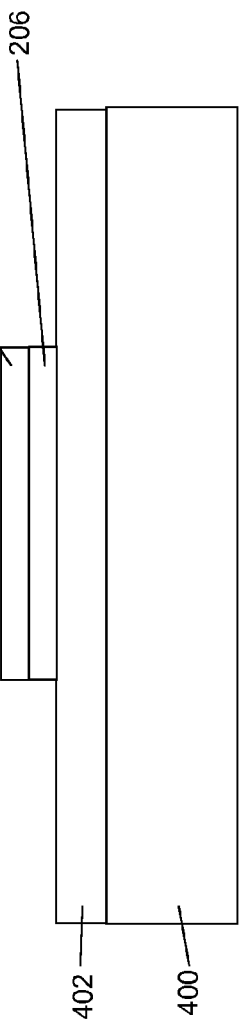

US 8,445,978 B2

ELECTROMECHANICAL TRANSDUCER DEVICE AND METHOD OF FORMING A ELECTROMECHANICAL TRANSDUCER DEVICE

FIELD OF THE INVENTION

This disclosure relates to micro or nano electromechanical transducer devices and methods of forming micro or nano electromechanical transducer devices.

BACKGROUND OF THE INVENTION

ElectroMechanical Systems include Micro ElectroMechanical Systems (MEMS) structures and Nano ElectroMechanical systems (NEMS) and MEMS and NEMS structures are used in a wide variety of applications including, for example, MEMS accelerometers in cars for airbag deployment or in consumer electronic devices such as game controllers, MEMS gyroscopes used in cars to detect yaw, optical switching, bio-MEMS applications, MEMS loudspeakers, inkjet printers and RF MEMS components such as antenna phase shifters. Advantages of using MEMS structures include they have mechanical properties but have small dimensions and can be manufactured using existing semiconductor processing technologies.

A MEMS transducer device, which may be used as an actuator or sensor, may include a movable structure fabricated on a semiconductor substrate including at least one mechanical stack comprising one or more mechanical layers of a material such as silicon or silicon nitride and at least one functional/actuating stack whose function is to facilitate the movement of the mechanical stack on actuation of the device. The actuating stack comprises one or more layers whose arrangement and function in relation to the mechanical stack depends on the type of MEMS transducer device. For example, in an electrostatic actuated device, the actuating stack comprises a stationary electrode that cooperates with a movable electrode formed on a mechanical layer to facilitate movement of the mechanical layer and movable electrode. In a magnetic actuated device, the functional stack comprises a magnetic layer which is arranged to apply an external force to the movable mechanical stack in cooperation with an external magnet. The actuating stack can also be a multi-layered stack including at least one actuating layer of a material such as a piezoelectric or a magnetic material formed over a mechanical stack such as a mechanical beam or cantilever. Due to its electromechanical conversion properties, lead zirconate titanate ($Pb[Zr_xTi_{1-x}]O_3$ with $0<x<1$) which is generally known as PZT, is the most commonly used piezoelectric material in MEMS devices. In the case of a piezoelectrically actuated MEMS switch device such as that shown in FIG. 1, the multi-layer movable structure includes an actuating layer comprising a PZT film 2 formed over a cantilever or beam 4 (which may be a silicon nitride or a silicon oxide cantilever) and electrodes 6 and 8 (which may be platinum electrodes) formed on either side of the PZT film 2 for applying a voltage across the PZT film. Contacts 10 and 12 provide the switch contacts of the device. As is well known, by applying appropriate voltages across the PZT film, the PZT film expands or contracts depending on the applied voltage by piezoelectricity which applies stress to the cantilever and results in the cantilever being deflected orthogonally (in a direction perpendicular to the stack) to open or close the MEMS switch device.

An article entitled 'Design, fabrication and RF performances of two different types of piezoelectrically actuated Ohmic MEMS switches' by Hee-Chul Lee, Jae-Hyoung Park, Jae-Yeong Park, Hyo-Jin Nam and Jong-Uk Bu in Journal of Micromechanics and Microengineering 15 (2005), pages 21098-2104, describes a piezoelectric actuated RF MEMS switch having a PZT capacitor formed on a cantilever.

US patent application no. 2005/0127792 describes a multi-layered piezoelectric switch for tunable electronic components comprising multiple piezoelectric layers, and metal layers alternated with the piezoelectric layers on a cantilever. Thus, this device uses stacked piezoelectric capacitors to form a piezoelectric actuated switch.

For MEMs transducer devices having a movable structure with at least one free end (for example, clamped with a single anchor) and being composed of multi-layer materials stacked together, the deflection of the movable structure can vary with temperature change due to the different values of the Coefficient of Thermal Expansion (CTE) for the different materials which form the movable structure, as in a bimetallic strip. This is especially true for piezoelectric actuated transducers. For example, for the piezoelectric actuated transducer of FIG. 1, the layers including the platinum (Pt) electrode 6, PZT film 2, and the platinum (Pt) electrode 8 of FIG. 1 will have a CTE of approximately 9.5 ppm/° C. compared to a CTE of 2-3 ppm/° C. of the silicon nitride cantilever 4. Thus, when the operation temperature changes, the Pt/PZT/Pt layers will expand (or contract) differently than the silicon nitride cantilever which results in changes in the transducers orthogonal deflection and thus, its performance. For example, for operation temperature changes over a 120° C. range, the piezoelectric MEMS switch device of FIG. 1 can experience a total deflection excursion of 7 µm. With large changes in the transducers deflection, the device may be made inoperable: for example, in the MEMS switch device of FIG. 1, the deflection due to temperature variations may cause the switch to be opened when it should be closed.

The same effect is seen in electrostatic switch devices having a movable structure with at least one free end and composed of a movable mechanical stack and a movable electrode layer formed on the moveable mechanical stack as part of the functional stack. The difference of the CTE of the materials of the two layers can produce a thermal induced actuation.

The deflection described for a movable structure with at least one free end is due to the bending effect of a mechanical moment or force due to the multi-layer stack. The mechanical moment or force is typically referred to as the bending moment. This bending moment can have the same effect on other movable structures, such as, for example, clamped structures where the bending moment, due to a multilayer stack, is not present along the full structure. Such clamped structures include transducer devices having a movable structure (such as a mechanical layer or membrane) which is supported or clamped at ends of the movable structure and an actuating structure (such as a piezoelectric, electrostrictive or magnetostrictive actuating stack) located at the ends or at the centre of the movable structure. The actuating structure has a bending effect or induces a bending moment on the movable structure which causes the movable structure to move. As with the free end movable structures described above, the bending moment induced in such clamped structures may also vary with temperature variations.

It is known to provide thermal compensation in electrostatic switch devices by having additional layers which are identical and symmetrical to the movable electrode so as to compensate for the thermal behaviour of the movable structure.

For example, U.S. Pat. No. 6,746,891 describes a tri-layered beam MEMS switch device which is actuated by an electrostatic charge. When a voltage is applied across a stationary electrode on a substrate and an opposing movable electrode on a movable beam, an equal and opposite charge is generated on the stationary electrode and movable electrode. The charge distribution on the opposing electrodes produces an electrostatic force that is balanced by the elastic forces on the now deformed beam. As the voltage is increased, the charge increases in a non-uniform and non-linear fashion across the surface of the beam until a stability point is reached. The stability point is defined by the inability of the elastic forces to maintain equilibrium with the electrostatic forces and the beam snaps through to establish contact between two switch contact pads. This patent describes how an electrode interconnect is formed on the beam, which electrode interconnect is a structural match or structurally similar to the movable electrode so as to provide robustness to film stress and temperature induced beam deformation. In one embodiment, this patent teaches that the electrode interconnect is fabricated of the same material and dimensioned the same in order to provide mechanical balance. It is assumed that the stress is the same in the additional layer and the movable electrode and that the beam needs to be flat in a natural state. The natural state (or when the device is in an inactive state) may be considered as the state with no applied voltage or more generally, the state without external energy for actuation.

For the electrostatic actuated device, only one (movable) electrode layer, combined with a stationary electrode layer, is required for the device to function. Therefore, it is not too complex to use a symmetrical tri-layered structure to realize the thermal/stress balance. For a more complicated device having multiple layers, such as piezoelectric actuated device, at least three layers (electrode/PZT/electrode) form the functional/actuating stack and a mechanical beam layer forms the mechanical stack. This makes the thermal balance more difficult to be met. Theoretically, the same symmetrical approach as used in the electrostatic actuated device can be used in an attempt to achieve thermal balance: that is, the same three layers can be deposited on the opposite side of the mechanical beam layer. In reality, however, this is complicated by manufacturing process variations. More layers mean more processing steps and larger variations, resulting in higher cost and less reproducibility. Also, the presence of the PZT layer before mechanical beam deposition may not be allowed due to serious contamination concerns.

In view of process constraints, it is not always possible to put the same material on both sides of the mechanical stack, due to serious contamination problems or because of process conditions. For example, a metallic layer used as a compensation layer for a metal electrode on top of a mechanical layer and made before the mechanical layer may not be compatible with the temperature deposition of the material of the mechanical layer. Thus, even for an electrostatic actuated device, there is a need to propose a solution to have improved thermal stability without using a symmetrical movable structure.

In addition to thermal stresses causing unwanted deformation or deflection of the movable beam in a MEMS device with variations in operating temperature, residual thin film stresses in the different layers of the multi-layered MEMS device can also cause unwanted deformation or deflection. Thin film stresses arise from the deposition processes used to produce the layers of the multi-layered device.

For example, in the case of the piezoelectrically actuated MEMS switch device, such as that shown in FIG. 1, having an actuating structure comprising Pt/PZT/Pt layers formed over a silicon nitride beam 4, the PZT film 2 needs to be annealed for crystallization. As a result, the stresses of the Pt/PZT/Pt actuating layers are substantially controlled by the 600-700° C. anneal temperature which ensures good piezoelectric properties. For a silicon nitride beam 4 formed by Low Pressure Chemical Vapor Deposition (LPCVD), there is a limited range of stress attainability (300 MPa-1100 MPa) for the beam. Thus, provided the stress of the beam which is required to achieve stress balance falls within this range, then stress balance can be achieved. However, it is not always possible to achieve stress balance between the actuating layers and the beam in the vertical direction so as to realise a flat beam (i.e. zero deflection or deformation in the vertical direction). Residual stress can result in a deflection of several micrometers at the tip of the beam. Achieving stress balance is more difficult with manufacturing steps requiring extreme temperatures.

An article entitled 'Mitigation of residual film stress deformation in multilayer microelectromechanical systems cantilever devices' by Jeffrey S. Pulskamp, Alma Wickenden, Ronald Polcawich, Brett Piekarski and Madan Dubey, in J. Vac. Sci. Technol. B 21(6), November/December 2003, pages 2482-2486 describes an approach to compensate for the residual thin film stress deformation in MEMS devices based upon analytical and numerical modelling and in-process thin film characterization. Using the equations which result from the modelling and detailed knowledge of the fabrication processes employed, the later deposition steps which possess the greater degrees of process control are used to form layers to compensate for the process variability in layer stress and thickness in the earlier processed films.

An article entitled 'Fabrication of PZT actuated cantilevers on silicon-on-insulator wafers for a RF microswitch' by Hong Wen Jiang, Paul Kirby and Qi Zhang in Micromachining and Microfabrication Process Technology VIII, San Jose Calif., USA 2003, pages 165 to 173, describes a processing scheme for fabricating PZT actuated silicon cantilevers using silicon-on-insulator wafers. A PZT actuating layer comprising a bottom titanium/platinum electrode, a PZT layer and a top Titanium/Gold electrode is formed on a silicon beam. A silicon dioxide interface layer is formed between the PZT actuating layer and the beam. Stress balancing is achieved during design of the device by determining the stress state of the layers that form the cantilever and choosing by calculation and appropriate adjustments in the deposition processes, the stress in the layers so that stress is balanced across the cantilever and relatively flat cantilevers can be obtained.

The methods described in these articles are focused solely on stress compensation and provide no details as to how to compensate for stress and thermal deformation. Generally, a solution found to balance stress does not necessarily provide a thermally balanced device.

Even a basic MEMs device using a symmetric movable structure may not be stress balanced if the layers below and above the mechanical layer have different residual stresses due to different deposition conditions.

SUMMARY OF THE INVENTION

The present invention provides a electromechanical transducer device and a method of forming a electromechanical transducer device as described in the accompanying claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings in which:

FIGS. 5-9 are schematic cross-section diagrams of the part of the micro electromechanical transducer device of FIG. 2 during different stages of fabrication;

Elements in the figures are illustrated for simplicity and clarity and have not necessarily been drawn to scale.

DETAILED DESCRIPTION

In the description that follows and in the Figures, certain regions are identified as being of a particular material, and/or type. However, this is merely for convenience of explanation and not intended to be limiting. Those of skill in the art will understand based on the description given herein that various materials can be used and that the disclosure is not limited to the particular examples given in the description.

The present disclosure will be described with reference to a piezoelectric actuated MEMS switch device. However, it will be appreciated that the disclosure is not limited to piezoelectric actuated MEMS switch devices and applies equally to other MEMS transducer devices such as sensors, actuators, accelerometers, optical switches, varactors, variable inductors, phase shifters and other means for actuation such as magnetic actuated transducer devices and electrostatic actuated MEMS devices and/or similar devices. Furthermore, the disclosure may also be used in Nano ElectroMechanical systems (NEMS) and thus is not limited to MEMS devices.

For the purpose of the disclosure, a transducer device is a device that converts one type of energy or physical attribute to another for various purposes including measurement, actuation or information transfer.

In addition, in the following description the different layers of the MEMS transducer device are described as having a certain position in the structure. However, it will be appreciated that the relative positions of the different layers are not limited to those described herein and may depend on the type of MEMS device and of the relative values of the CTE of the materials which form the layers.

Figure 2:
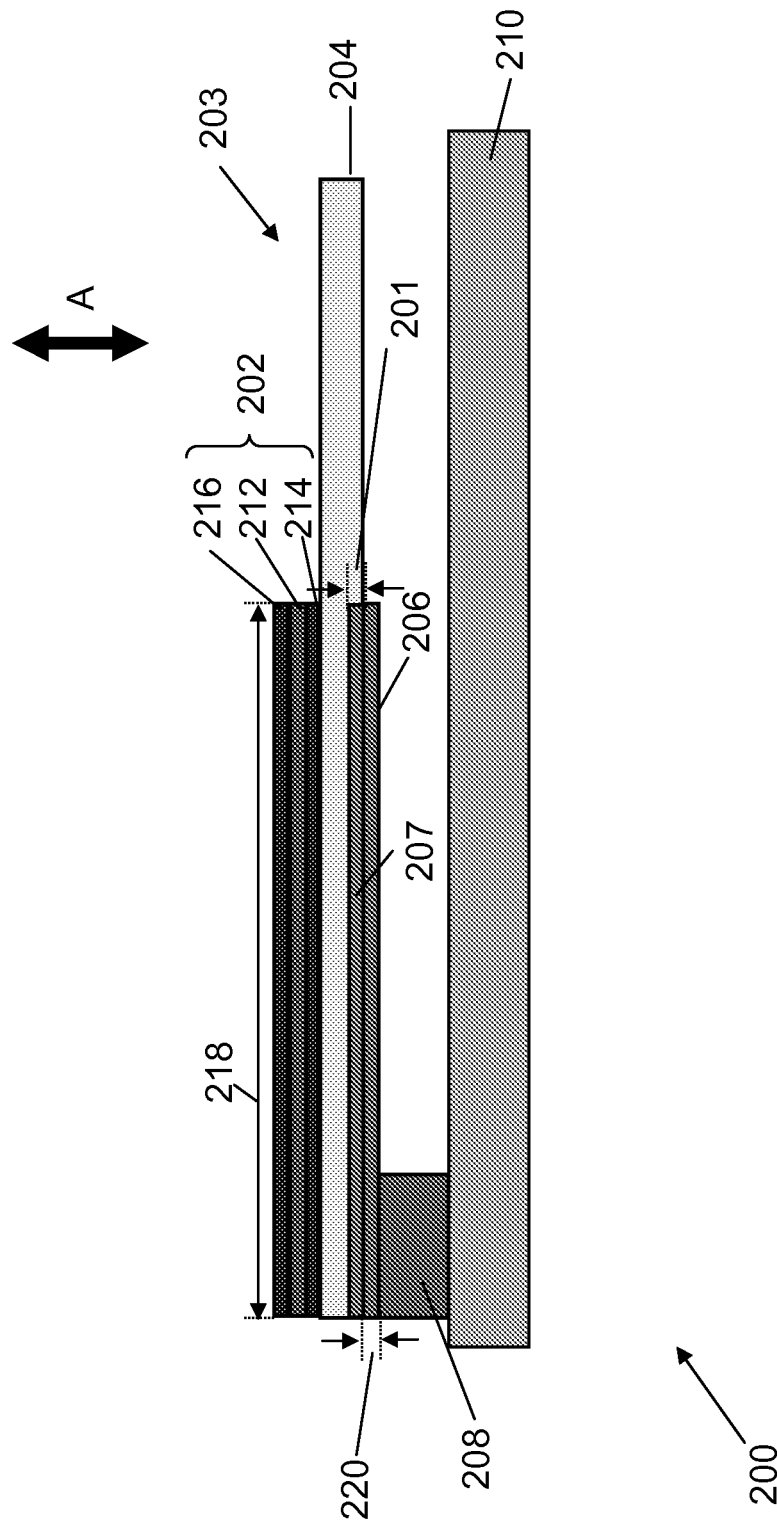
FIG. 2 is a schematic cross-section diagram of part of an example of a electromechanical transducer device in accordance with an embodiment of the disclosure.

Referring now to FIG. 2, an example of a micro electromechanical switch (MEMS) device 200 in accordance with an embodiment of the disclosure and formed over a substrate 210 comprises an actuating structure comprising a plurality of layers 202 including a piezoelectric layer 212, and a movable structure 203 which is arranged to be movable in response to actuation of the actuating structure. For example, the movable structure 203 may be arranged to be movable in a direction (e.g. along line A shown in FIG. 2) which direction is substantially perpendicular to a main plane of the layers 202 of the actuating structure and movable structure 203. The movable structure 203, in the example shown in FIG. 2, includes the plurality of actuating layers 202 of the actuating structure, a mechanical structure 204, a first compensation layer 206 and a second compensation layer 207. It will be appreciated that in other MEMS devices, the actuating structure may comprise at least one layer as part of the movable structure and at least one layer which is not part of the movable structure: e.g. an electrostatic actuated device may comprise an actuating structure having a movable electrode formed as part of the movable structure and also a stationary electrode formed on a substrate. Due to process requirements, the movable structure may further comprise additional thin layers, such as for example, seed layers or buffer layers. In the example shown in FIG. 2, mechanical structure 204 comprises a mechanical layer or beam 204 and is a cantilever supported by an anchor 208 which is formed on a substrate 210. The anchor can be at one end of the structure as shown in the drawing or at a different place. The mechanical structure may alternatively comprise more than one layer. The movable structure has at least one free end. The beam 204 is arranged to be movable by the actuating structure in response to piezoelectric actuation of the actuating structure, for example, by applying appropriate voltages across the piezoelectric layer 212.

The plurality of layers 202 of the actuating structure have a different thermal response characteristic to that of the beam 204. The thermal response characteristic of a layer depends on the CTE of the material(s) that makes up the layer. When a layer is added to a structure, the layer produces a thermal effect and the thermal effect of such a layer depends on parameters such as the CTE and Young's Modulus of the material(s) that makes up the layer and on the thickness of the structure's layer(s). The thermal effect produced by the plurality of layers 202 of the actuating structure formed on the mechanical layer 204 and having different thermal response characteristics leads to the movement or deflection of the movable structure 203 with variations in temperature.

The plurality of layers 202 of the actuating structure have a different stress response characteristic to that of the beam 204. The stress response characteristic of a layer depends on the Young's Modulus of the material(s) that makes up the layer and the residual stress or strain defined by reference to a substrate on which the layer is formed. When a layer is added to a structure, the layer produces a stress effect and the stress effect of such a layer depends on parameters such as the residual stress, Young's Modulus of the material(s) that makes up the layer and on the thickness of the structure's layer(s). The stress effect produced by the plurality of layers 202 of the actuating structure formed on the mechanical layer 204 and having different stress response characteristics leads to the movable structure 203 being moved or deflected for example from a flat position on release of the device and so when the device is in an inactive state (e.g. when the actuating structure is not actuated).

The first 206 and second 207 compensation layers are arranged to compensate a thermal effect produced by the different first and second thermal response characteristics of the mechanical layer 204 and the plurality of layers 202 of the actuating structure such that movement of the movable structure 203 is substantially independent of variations in temperature and to adjust a stress effect produced by the different first and second stress response characteristics of the mechanical layer 204 and the plurality of layers 202 of the actuating structure such that the movable structure is deflected a predetermined amount relative to the substrate when the electromechanical transducer device 200 is in an inactive state (e.g. on release and when the actuating structure is not actuated which may be with no applied voltage). The predetermined amount of deflection of the movable structure 203 when the electromechanical transducer device is in an off state includes a predetermined range of deflection values relative to a plane parallel to a surface of the substrate 210. The predetermined amount may include zero deflection and in this case, the movable structure 203 is flat with respect to the substrate 210.

Since the thermal effect of a layer depends on parameters such as the CTE and Young's Modulus of the material(s) that makes up the layer and on the thickness of the layer and the stress effect of a layer depends on parameters such as the residual stress, Young's Modulus of the material(s) that makes up the layer and on the thickness of the layer, the first 206 and second 207 compensation layers are arranged to compensate the thermal effect by selecting materials for the first 206 and second 207 compensation layers according to 'intrinsic' parameters such as CTE, Young's modulus, and by arranging for the compensation layers to have appropriate thicknesses in order to provide the desired compensation.

Thus, the first 206 and second 207 compensation layers may be arranged, for example, by selecting materials having appropriate CTEs, Young's Modulus, residual stress and the thickness of the layers 206, 207 so that both the compensation layers 206 and 207 compensate for the stress effect and the temperature effect. Alternatively, and as will now be described in more detail in the following, the first compensation layer 206 may provide a thermal compensation layer 206 and the second compensation layer 207 may provide a stress compensation layer 207, wherein the thermal compensation layer 206 is arranged to compensate the thermal effect and the stress compensation layer 207 is arranged to compensate the stress effect.

In the example shown in FIG. 2, the thermal compensation layer 206 is different to the actuating layers 202. In other words, the thermal compensation layer 206 has a different configuration or structure, such as a different number of layers and/or different materials which form the compensation layer(s), to that of the actuating structure forming part of the movable structure and is not symmetric with the movable actuating structure. Furthermore, the thermal compensation layer 206 is designed so that its thermal effect balances or compensates the thermal effect of at least the actuating layers 202 when added to the beam 204 such that the movement of the movable structure 203 is substantially independent of variations in temperature. It will however be appreciated that the technique of having a movable structure which includes a thermal compensation layer to compensate for thermal effects and a stress compensation layer to compensate for stress effects may alternatively be used in the case when the thermal compensation layer is symmetric with the movable actuating structure in the sense that it has the same structure or configuration.

In an example, the thermal compensation layer 206 comprises a compensation layer formed of material different to that of the actuating layers 202 of the actuating structure. The compensation layer may comprise one or two layers only. As stated above, in order to compensate the thermal effect of the actuating layers 202 and the beam 204, the thermal compensation layer 206 is designed, for example, by choosing the appropriate material or combination of materials for forming the layer 206 and the thickness of the thermal compensation layer 206 so that the movement or deflection of the movable structure 203 is controlled at room temperature and does not change significantly across the operating temperature range.

The stress compensation layer 207 comprises one or more layers and is designed so that its mechanical stress effect balances or compensates the mechanical stress effect of the at least the combination of the actuating layers 202, and the beam 204 and in the example shown in and described with reference to FIG. 2, also the thermal compensation layer 206. As stated above, in order to compensate the stress effect of the movable stack including the actuating layers 202 and the beam 204, the stress compensation layer 207 is designed, for example, by choosing the appropriate material or combination of materials for forming the layer 207 and the thickness of the stress compensation layer 206. The compensation may result in a flat movable structure 203 with zero deflection in relation to the substrate 210 or may result in a predetermined deflection controlled by the stress compensation layer 207 depending on the requirements of the application of the device. The stress compensation layer 207 may be further arranged so that it has negligible impact on the thermal balance across the transducer device. In other words, the stress compensation layer 207 may be arranged so that when added to the stack which includes the actuating layers 202 and the beam 204, it produces no thermal effect. Ensuring that the stress compensation layer 207 has negligible impact on the thermal balance of the device can be achieved by ensuring the thermal response characteristic of the stress compensation layer 207 is substantially the same as the thermal response characteristic of the beam 204: For example, the CTE of the stress compensation layer 207 is selected to be the same as the CTE of the beam 204 or the CTE of the stress compensation layer 207 is selected to be similar to the CTE of the beam 204 with a low Young's modulus.

Figure 10:
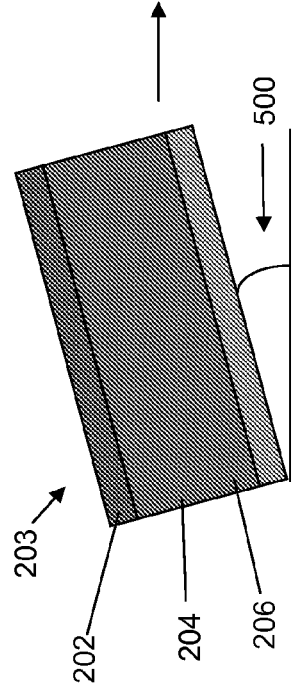
FIGS. 10-12 are simplified schematic cross-section diagrams of different examples of the movable structure of an electromechanical transducer device in accordance with embodiments of the disclosure showing different deflections of the movable structure.
Figure 11:
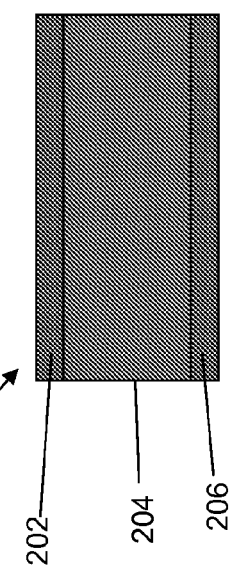
Figure 12:
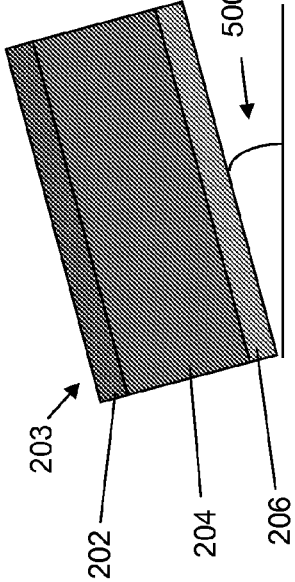

FIGS. 10-12 show examples of the different deflections, represented by angle 502, in relation to a surface of the substrate 210 of the movable structure 203 that may be achieved by the compensation layers 206 and 207 on release and when the device is in an off state. The desired deflection may depend on the application: for example, for a MEMS switch device, it may be required that when the device is in an off state, the movable structure 203 is deflected a certain amount in order to make or break contact with another switch contact pad.

In FIG. 10, the thermal compensation layer 206 has a different configuration to that of the actuating layers 202 and is selected to compensate for the thermal effect of the actuating layers 202 and the beam 204. However, due to the stress effect of the different layers, the resulting stack (excluding the stress compensation layer 207) on release would have a deflection of angle 500. An appropriate stress compensation layer 207 is then added in order to ensure a flat movable structure 203 on release (that is, the angle 502 is zero or the amount of deflection is zero).

In FIG. 11, the thermal compensation layer 206 has the same configuration as that of the actuating layers 202 (ie. is symmetric with the actuating layers 202) in order to provide thermal balance. In this example, the resulting stack (excluding the stress compensation layer 207) on release would have a zero degree deflection as the stress in the beam 204 has no stress effect. For an application requiring the movable structure 203 to be deflected on release, an appropriate stress compensation layer 207 is then added in order to ensure that the movable structure 203 is deflected by a predetermined angle 502 or predetermined amount on release.

In FIG. 12, the thermal compensation layer 206 has a different configuration to that of the actuating layers 202 and is selected to compensate for the thermal effect of the actuating layers 202 and the beam 204. However, due to the stress effect of the different layers, the resulting stack (excluding the stress compensation layer 207) on release would have a deflection of angle 500. For an application requiring the movable structure 203 to be deflected on release, an appropriate stress compensation layer 207 is then added In order to ensure that the movable structure 203 is deflected by a predetermined angle 502 or predetermined amount on release.

As can be seen from the above, the predetermined angle or predetermined deflection amount depends on the application and in some cases, it may be acceptable to define a predetermined range of deflection values so that a deflection within that range would be acceptable.

Figure 1:
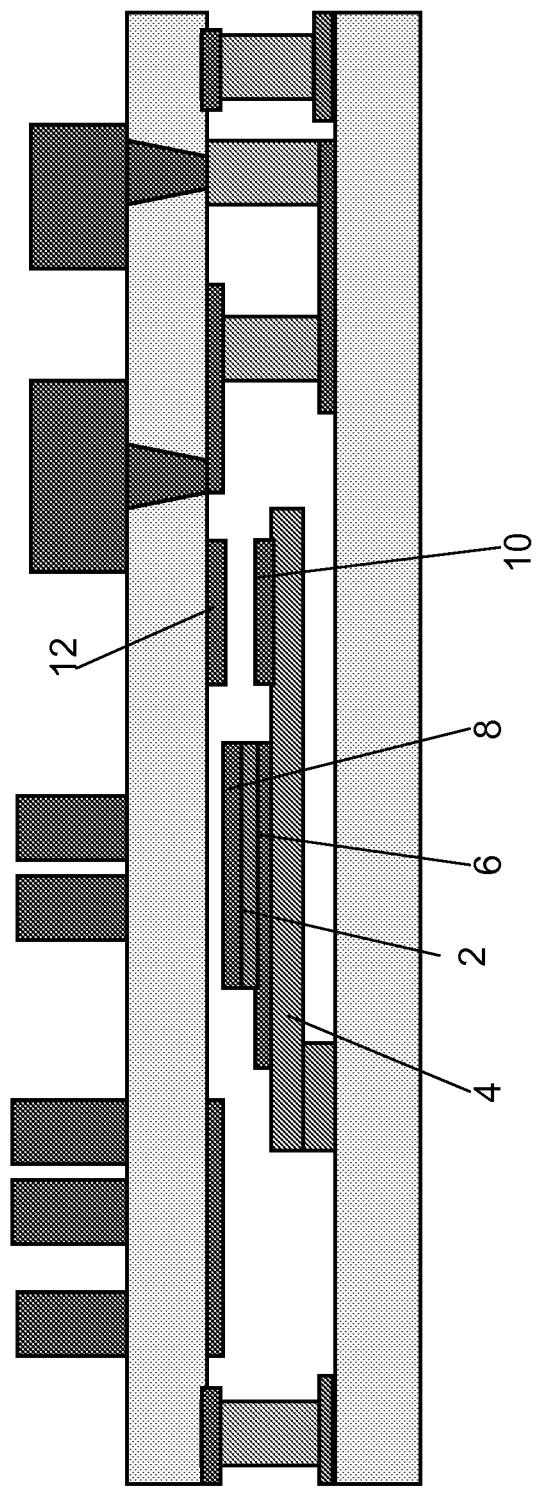
FIG. 1 is a schematic cross-section diagram of part of a typical piezoelectric MEMS switch device.

It will be appreciated that the MEMS switch device 200 may include other elements, such as switch contact pads (see FIG. 1), but these other elements are not shown for simplicity.

In a magnetic actuated MEMS device, the actuating structure includes a magnetic layer instead of a piezoelectric layer formed as part of the movable structure 203. In an electrostatic actuated MEMS device, the actuating structure includes a movable electrode on the beam and an opposing stationary electrode.

In the example shown in FIG. 2, the thermal compensation layer 206 is formed on the same side of the beam 204 as the stress compensation layer 207 and on the opposite side of the beam 204 to the actuating layers 202. In this example, the thermal compensation layer 206 is designed so that its CTE is substantially the same as the CTE of the actuating layers 202 and the stress compensation layer 207 is formed adjacent the beam 204 and so as to have negligible impact on the thermal balance of the MEMS device. Alternatively, the thermal compensation layer 206 may be formed on the same side of the beam 204 as the actuating layers 202. In another example, the stress compensation layer 207 may be formed on the opposite side of the beam 204 to that of the thermal compensation layer 206.

FIG. 2 also shows the actuating layers 202 being formed on top of the beam 204. It will be appreciated that alternatively, the actuating layers 202 may be formed under the beam 204 with the thermal compensation layer 206 and stress compensation layer 207 being formed on the opposite side of the beam 204 or on the same side of the beam 204 as the actuating layers 202 as discussed above.

It will be appreciated that the purpose of the temperature 206 and stress 207 compensation layers is to provide a stress balanced and thermally compensated device. In an example to be described in more detail below, this is achieved by first determining the structure of the thermal compensation layer 206 and then determining the structure of the stress compensation layer 207. For example, for a thermal compensation layer 206 comprising a single layer, first the material of the thermal compensation layer 206 is selected, for example, from a list of materials which are compatible with the process used to manufacture the MEMS device, and then the thickness of the thermal compensation layer 206 is determined. The material and thickness of the stress compensation layer 207 is then determined.

The thickness and position of the compensation layers can be derived from finite element simulations or analytical analysis.

Figure 3:
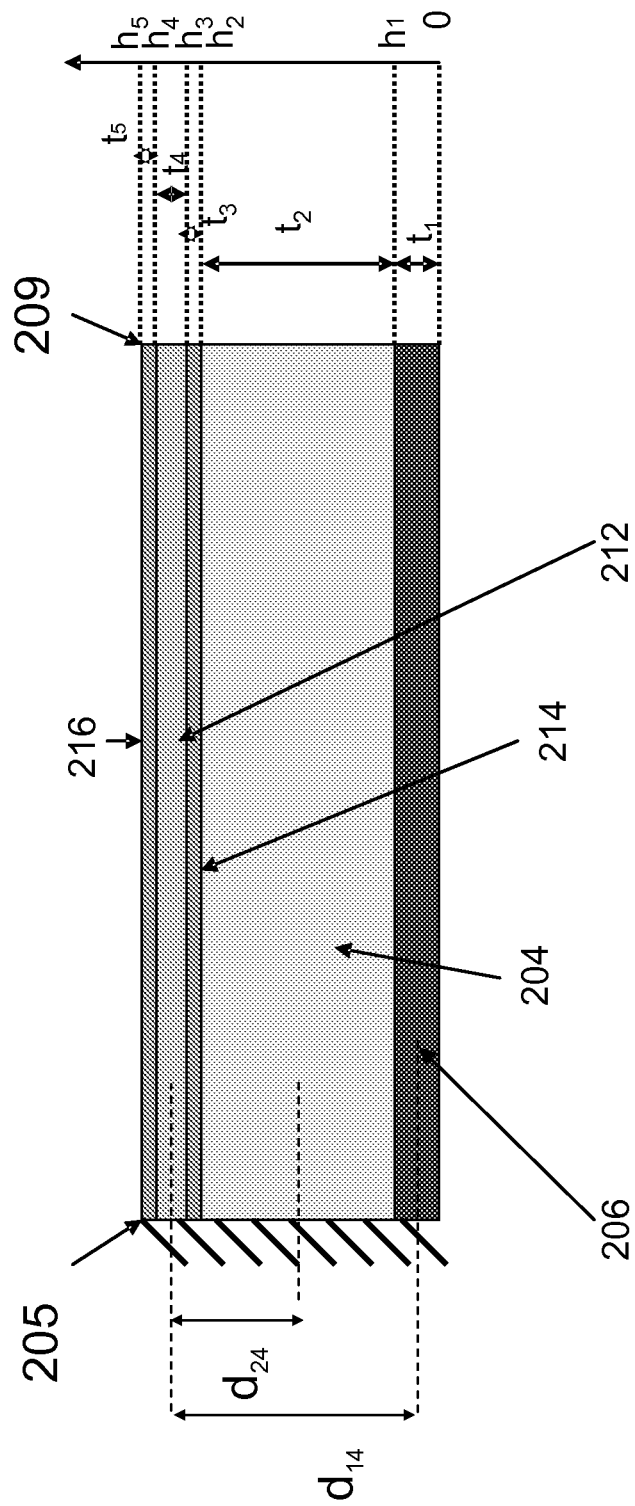
FIG. 3 is a schematic cross-section diagram of the movable structure of FIG. 2 showing parameters used to calculate the deflection of the movable structure.

The full mathematical description of the deflection of a free-clamped cantilever beam made of a multilayer can be derived from the publication of Hsuch (C. H. Hsuch, Thermal Stresses in Elastic Multilayer Systems, Thin Solid Film 418 (2002) 182-188). FIG. 3 shows the multilayer movable structure or cantilever shown in FIG. 2 with the parameters used in the mathematical description and having a clamped end 205 and a free end 209.

According to these parameters and based on the publication of Hsuch, one can obtain the deflection δ of the free end 207 of the cantilever due to the thermal effect as:

$$\delta = -\frac{3L^2}{2} \cdot \frac{\sum_{i=1}^{5} E_i t_i (c - \alpha_i \Delta T)(2h_{i-1} + t_i)}{\sum_{i=1}^{5} E_i t_i [6h_{i-1}^2 + 6h_{i-1}t_i + 2t_i^2 - 3t_b(2h_{i-1} + t_i)]} \quad \text{Equation 1}$$

$$\text{With } c = \frac{\sum_{i=1}^{5}(E_i t_i \alpha_i \Delta T)}{\sum_{i=1}^{5} E_i t_i} \text{ and } t_b = \frac{\sum_{i=1}^{5} E_i t_i (2h_{i-1} + t_i)}{2\sum_{i=1}^{5} E_i t_i}$$

Where:

$E_i$ is the Young's modulus of layer i;

$t_i$ is the thickness of layer i;

L is the length of the actuator (length 218 shown in FIG. 2);

$\alpha_i$ is the CTE of layer i;

$h_i$ is the distance between the top of layer i and the bottom of the stack used as origin (note that $h_0=0$);

$\Delta T$ is the difference between the working temperature experienced by the device and the reference temperature (typically 25° C.).

In order to compensate (at least partially) the thermal effect and provide a zero degree deflection, a goal is to choose a material and thickness for the thermal compensation layer 206 which induces δ=0 whatever $\Delta T$. According to equation 1 and the value of c, the following equation can be derived first for the deflection of the beam:

$$\delta_T = \frac{-6 \cdot L^2 \cdot \sum_i \sum_{j>i} d_{ij} \cdot E_i \cdot E_j \cdot t_i \cdot t_j (\alpha_j - \alpha_i) \cdot z_{ij}}{\sum_i E_i^2 \cdot t_i^4 + \sum_i \sum_{j>i} E_i \cdot E_j \cdot t_i \cdot t_j \cdot (12d_{ij}^2 + t_i^2 + t_j^2)} \Delta T_0 \quad \text{Equation 2}$$

where:

$\delta_T$ represents the deflection variation of the beam over the full operational temperature range and which is positive for an upward deflection;

$d_{ij}$ is the distance between layers i and j, measured from the middle of the layers;

$\Delta T_0$ is the full operational temperature range of the device; and $z_{ij}$ is equal to 1 when layer j is above layer i and equals to −1 when layer j is below layer i.

The condition to remove the thermal effect may then be described as:

$$m_T = \sum_i \sum_{j>i} d_{ij} \cdot E_i \cdot E_j \cdot t_i \cdot t_j (\alpha_i - \alpha_j) \cdot z_{ij} \cdot \Delta T_0 \quad \text{Equation 3a}$$

$$m_T = 0$$

The deflection described by Equation 2 is due to a bending moment acting on the beam which is proportional to the value of $m_T$ (thermal bending moment) given by Equation 3a. When $m_T=0$, there is no bending moment and so there is no deflection. Thus, by solving equation 3a for $m_T=0$, a suitable thickness for the compensation layer 206 may be determined.

Figure 14:
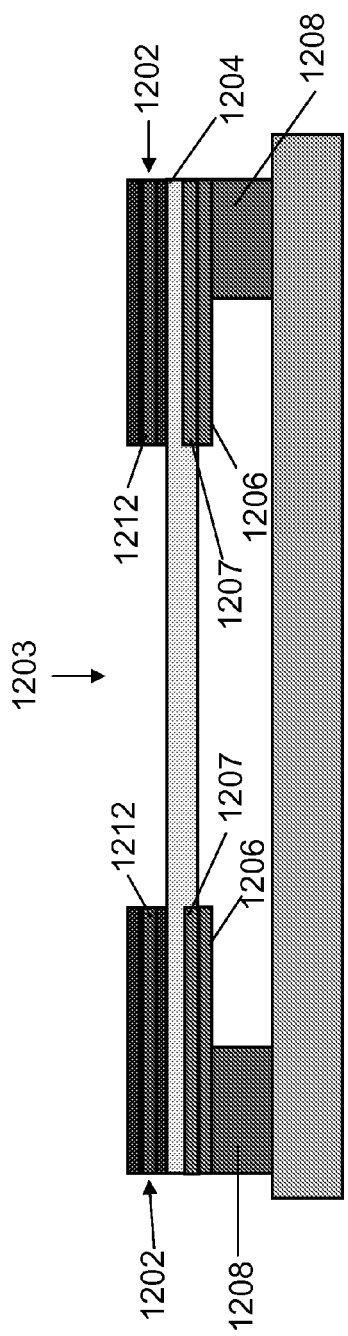
FIG. 14 is a schematic cross-section diagram of part of an example of a micro electromechanical transducer device in accordance with another embodiment of the disclosure.
Figure 15:
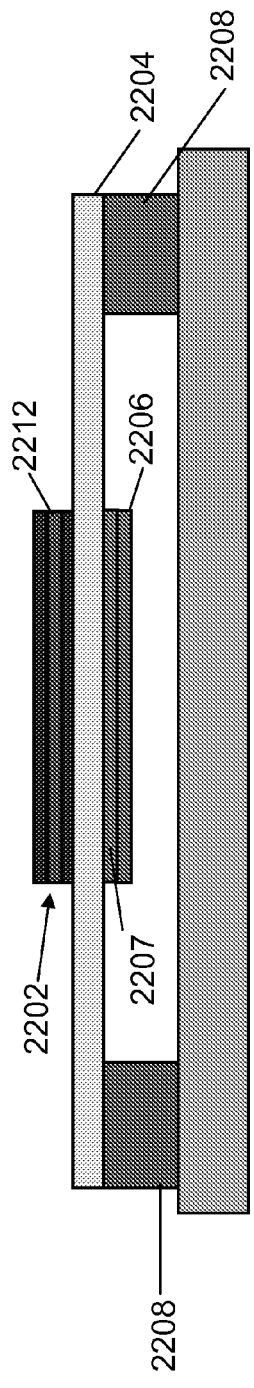
FIG. 15 is a schematic cross-section diagram of part of an example of a micro electromechanical transducer device in accordance with another embodiment of the disclosure.

Although the disclosure describes reducing the thermal effect for a beam structure having a free end (as shown in FIG. 2), it will be appreciated that the disclosure may also be applied to other structures sensitive to a bending moment, such as the clamped structures shown in FIGS. 14 and 15, where the bending moment may also be proportional to $m_T$ given by Equation 3a. In the embodiments disclosed in FIGS. 14 and 15, the device comprises a movable structure 1203, 2203 supported or clamped at ends by an anchor 1208, 2208 with at least one layer 1202, 2202 of the actuating structure formed on a portion of the movable structure 1203, 2203. The at least one layer may be formed on a top surface of the movable structure or on a bottom surface of the movable structure 1203, 2203. FIG. 14 shows that the at least one layer of the actuating structure is formed in substantially a central portion of the movable structure and on a top surface of the movable structure and FIG. 15 shows that the at least one layer of the actuating structure is formed on end portions of the movable structure and on a top surface of the movable structure. First 1206, 2206 and second 1207, 2207 compensation layers are located with the at least one layer of the actuating structure. The actuating structure may be a piezoelectric, electrostrictive or magnetostrictive structure.

For these kind of transducer devices, it is known that the actuation of the device may be equivalent to a variation of stress (called actuating stress) $\sigma^A$ in an actuating layer. For example, for a piezoelectric actuating layer, it is known that $$\frac{\sigma^A}{E} = \frac{d_{31} V}{T_A}$$

where d31 is the piezoelectric coefficient, V is the voltage applied to the piezoelectric actuating layer, E is the Young's modulus of the layer and $T_A$ is the thickness of the actuating layer.

For a multilayered structure defined by equivalent actuating stress in each layer (eventually equal to 0), the actuating bending moment $m_A$ is then proportional to:

$$m_A = \sum_i \sum_{j>i} d_{ij} \cdot E_i \cdot E_j \cdot t_i \cdot t_j \left(\frac{\sigma_j^A}{E_j} - \frac{\sigma_i^A}{E_i}\right) \cdot z_{ij} = 0 \quad \text{Equation 3b}$$

In an example, the thermal compensation provided by the thermal compensation structure may be designed so that the ratio between $m_T$ and $m_A$ is small enough to avoid thermal actuation when compared to the regular actuation (e.g. due to applying a voltage to a piezoelectric actuating layer). For example, the material and thicknesses of the layers may be chosen so that $m_T/m_A$ is less than 50%. In other words, in an example embodiment, a range for the thickness of the compensation layer can be obtained by solving equation 3a and then by using the condition on the ratio between $m_T$ and $m_A$ given above or some percentage (say 10%) of the solution to equation 3a.

FIG. 14 shows a MEMS device 1000 in accordance with another embodiment of the disclosure comprising a movable structure 1203 which is arranged to be movable in response to actuation of an actuating structure. The movable structure 1203 includes a mechanical structure 1204 comprising a mechanical layer or membrane 1204 supported at ends of the mechanical layer 1204 by anchors 1208. The actuating structure comprises a plurality of layers 1202, including a piezoelectric layer 1212, formed at the ends of the mechanical layer 1204. First 1206 and second 1207 compensation layers are provided at the ends of the mechanical layer 1204 with the layers of the actuating structure to facilitate compensation of the thermal and stress effects in the MEMs device 1000. Like components to those of FIG. 2 are referred to by the same reference numeral plus the number 1000.

FIG. 15 shows a MEMS device 2000 in accordance with another embodiment of the disclosure comprising a movable structure 2203 which is arranged to be movable in response to actuation of an actuating structure. The movable structure 2203 includes a mechanical structure 2204 comprising a mechanical layer or membrane 2204 supported at ends of the mechanical layer 2204 by anchors 2208. The actuating structure comprises a plurality of layers 2202, including a piezoelectric layer 2212, formed at substantially the centre of the mechanical layer 2204. First 1206 and second 1207 compensation layers are provided at substantially the centre of the mechanical layer 2204 with the layers of the actuating structure to facilitate compensation of the thermal and stress effects in the MEMs device 2000. Like components to those of FIG. 2 are referred to by the same reference numeral plus the number 2000.

As Ei, αi, ti, hi are known for all the materials involved in the multilayer movable structure 203, theoretically, many different materials which are technologically compatible with the manufacturing processes used to form the multilayer movable structure can be chosen for compensating thermally the movable structure. Indeed, if one chooses a material for compensation, E and α are known for this material and the last unknown is the suitable thickness t of this layer which can be determined by solving equation 3a. However, in some cases, the resolution of equation 3a can induce a negative thickness which means that there is no solution.

Equation 3a defines the targeted specifications for the compensation layer 206 for when the goal for the deflection of the movable structure is to be independent of temperature. For each application of the MEMS device, it is possible, starting from the product specifications, to define a maximum acceptable deflection variation δm over a temperature range: that is, the deflection amount due to temperature variations may be non-zero. For example, for a RF MEMS switch for the OFF state, δm will be defined to maintain the isolation characteristics of the switch for the OFF state, and so that the theoretical deflection for the ON state is always higher than the gap. In general, for an actuator defined by its maximum deflection variation δa between ON and OFF state at room temperature, δm can be defined as a fraction of δa, for example 50%.

Equation 2 can be used in this case to define a range of possible values for the specifications of the compensation layer 206 by targeting a value of δT lower than δm.

A first way to simplify equation 2 is to make an assumption that the thickness of the layer called "the thermal compensation layer 206" is small at least when compared to some of the other layers. More precisely, it is assumed that, choosing n for the numbering of the thermal compensation layer, equation 2 can be approximated by $$\delta_T = \frac{-6 \cdot L^2 \cdot \left[ \sum_{i \neq N} \sum_{N>j>i} d_{ij}^* \cdot E_i \cdot E_j \cdot t_i \cdot t_j (\alpha_j - a_i) \cdot z_{ij} + t_N \cdot \sum_{i \neq N} d_{iN}^* \cdot E_i \cdot E_N \cdot t_i (\alpha_N - \alpha_i) \cdot z_{iN} \right]}{\sum_{i \neq N} E_i^2 \cdot t_i^4 + \sum_{i \neq N} \sum_{N>j>i} E_i \cdot E_j \cdot t_i \cdot t_j \cdot (12 d_{ij}^{*2} + t_i^2 + t_j^2)} \Delta T_0 \quad \text{Equation 4}$$

Where:

dij* is the distance between the layers i and j without taking into account the thickness of layer N.

The thickness of the thermal compensation layer is then given by $$t_N = \frac{-\sum_{i \neq N} \sum_{N>j>i} d_{ij}^* \cdot E_i \cdot E_j \cdot t_i \cdot t_j (\alpha_j - \alpha_i) \cdot z_{ij}}{\sum_{i \neq N} d_{iN}^* \cdot E_i \cdot E_N \cdot t_i \cdot (\alpha_N - \alpha_i) \cdot z_{iN}} \quad \text{Equation 5}$$

In order to ensure that the thickness given by equation 5 is positive, the position of layer N on the stack downward or upward can be moved to provide a solution with a positive value since the sign of the denominator of Equation 5 takes two opposite values when layer N moves from the top of the stack (zNi always positive) to the bottom of the stack (zNi always negative).

In order for a value given by equation 5 for the thickness of the compensation layer to be an acceptable solution, the value cannot be too high so as to avoid having very thick thermal compensation layers. Thus, in order to provide a small value for tN, it is better to choose a thermal compensation layer which has a thermal characteristic as different as possible to the thermal characteristic of the thicker layers.

Figure 13:
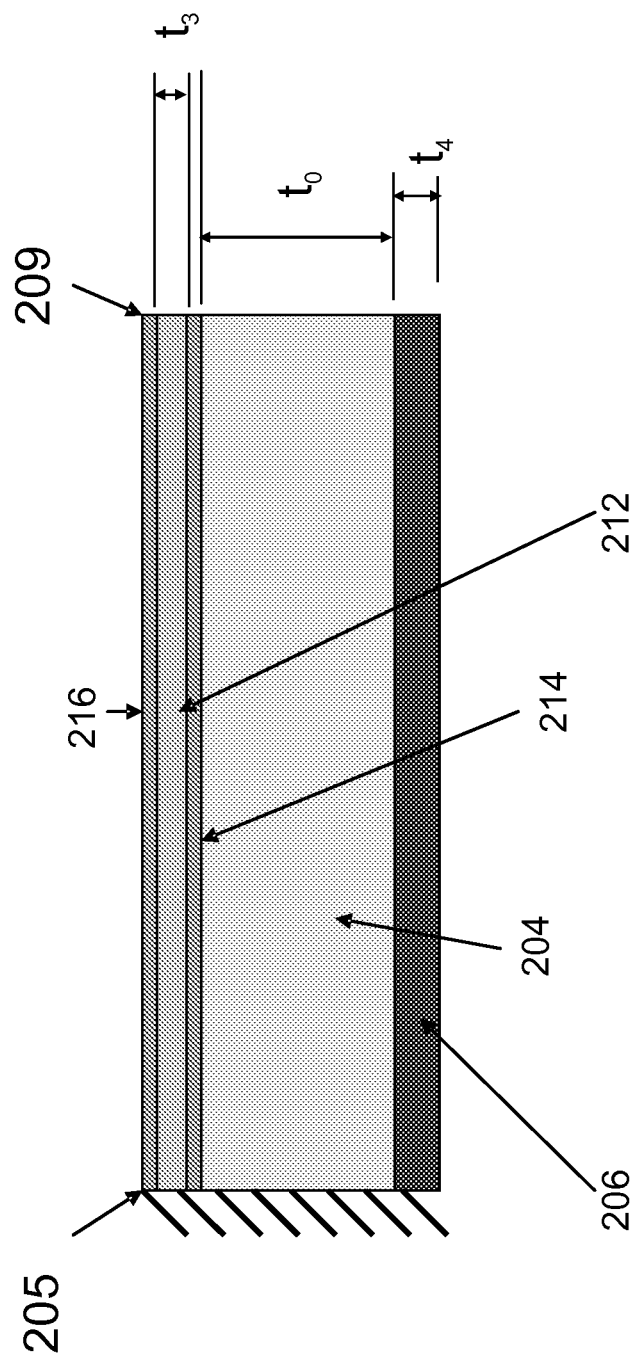
FIG. 13 is a schematic cross-section diagram of the movable structure of FIG. 2 showing parameters used to calculate the deflection of the movable structure.

Another way to simplify this equation 2 is to make the assumption that the thickness of all the layers are small compared to one layer. In a practical example, the one layer is called the mechanical layer 204. With this assumption, equations 2 and 3 can be approximated as $$\delta_T = \frac{-3L^2}{E_0 \cdot t_0^2} \sum_{i \neq 0} \cdot E_i \cdot \bar{t}_i \cdot (\alpha_i - \alpha_0) \quad \text{Equation 6a}$$

$$\sum_{i \neq 0} \cdot E_i \cdot \bar{t}_i \cdot (\alpha_0 - \alpha_i) = 0 \quad \text{Equation 6b}$$

where:

i=0 is the thickest mechanical layer having a thickness $t_0$, $\bar{t}_i$ is the algebraic thickness, positive on top of the mechanical layer and negative below the mechanical layer as shown for example in FIG. 13 where $\bar{t}_4 = -t_4$, and $\bar{t}_3 = t_3$.

In this case, starting from a given material for all the layers 1 to n−1 (except one noted n), there is always a given algebraic thickness (so thickness and position (top or bottom)) for the nth layer given by the equation:

$$\bar{t}_n = \frac{\sum_{i=1}^{n-1} E_i \bar{t}_i (\alpha_i - \alpha_0)}{E_n (\alpha_0 - \alpha_n)} \quad \text{Equation 7}$$

Depending on the value of CTE, the position of the thermal compensation layer 206 can be on the side of the actuating layers 202 or on the opposite side. The algebraic thickness of the compensation layer 206 is not only dependent on the CTE but depends also on the value of the Young's modulus of the material used for the compensation layer 206. In order to avoid having only a compensation layer which exhibits a second order thermal effect, a compensation layer 206 with a CTE different from the CTE of the mechanical layer 204 may be used which confirms what was deduced from equation 5.

Equations 5 or 7 can be used to find a first set of parameters for an approximated solution. This first set can then be adjusted by using equation 4 or a finite element simulation.

Once again, equation 5 and 7 give the targeted thickness for the compensation layer 206 and equation 6a can be used to define a range of acceptable values when comparing δ0 to δm.

When a solution for thermal compensation has been found, equations 4 and 6a can be represented generally by $$\delta_T = a_T \cdot t_N - \delta_{T,0} \quad \text{Equation 8}$$

where δT,0 and aT are independent of the value of $t_N$ and have the same sign (because the ratio δT,0 over aT is the thickness for thermal effect cancellation).

Equation 4 gives, for example, values for δT,0 and aT as:

$$\delta_{T,0} = \frac{-6 \cdot L^2 \cdot \left[ \sum_{i \neq N} \sum_{N>j>i} d_{ij}^* \cdot E_i \cdot E_j \cdot t_i \cdot t_j (\alpha_j - a_i) \cdot z_{ij} \right]}{\sum_{i \neq N} E_i^2 \cdot t_i^4 + \sum_{i \neq N} \sum_{N>j>i} E_i \cdot E_j \cdot t_i \cdot t_j \cdot (12 d_{ij}^{*2} + t_i^2 + t_j^2)} \Delta T_0$$

$$a_T = \frac{-6 \cdot L^2 \cdot \left[ \sum_{i \neq N} d_{iN}^* \cdot E_i \cdot E_N \cdot t_i (\alpha_N - \alpha_i) \cdot z_{iN} \right]}{\sum_{i \neq N} E_i^2 \cdot t_i^4 + \sum_{i \neq N} \sum_{N>j>i} E_i \cdot E_j \cdot t_i \cdot t_j \cdot (12 d_{ij}^{*2} + t_i^2 + t_j^2)} \Delta T_0$$

Equation 6a gives, for example, values for δT,0 and aT as:

$$\delta_{T,0} = \frac{3L^2}{E_0 \cdot t_0^2} \sum_{i \neq 0, i \neq n} \cdot E_i \cdot \bar{t}_i \cdot (\alpha_i - \alpha_0)$$

$$a_T = \frac{-3L^2}{E_0 \cdot t_0^2} \sum_{i \neq 0} \cdot E_n \cdot z_{0n} \cdot (\alpha_n - \alpha_0)$$

In this case, for a maximum thermal deflection lower than a given value of δm, the range of possible thicknesses for the compensation layer is $$\frac{\delta_{T,0}}{a_T} - \frac{\delta_m}{|a_T|} < t_N < \frac{\delta_{T,0}}{a_T} + \frac{\delta_m}{|a_T|} \quad \text{Equation 9}$$

The residual stress in the different layers of the movable structure 203 is measured, for example, by measuring the deflection of a silicon wafer with a single layer of material whilst taking into account the effect of the full process flow by using, for example, the same annealing temperature.

At this stage, the MEMS device could be "naturally" balanced (as defined below) with zero deflection or the MEMS device could have 'naturally' the right predetermined deflection and so no additional change has to be made in the design to balance for stress.

More typically, the MEMS device is not stress balanced (or does not have the desired predetermined deflection). Therefore, stresses need to be adjusted to obtain the targeted or desired deflection.

The stress of functional or actuating layers 202 or thermal compensation layers 206 is usually difficult to adjust as these layers are made of specific materials with specific properties determined by other device characteristics such as piezoelectric and/or thermal expansion coefficients. This is the case, for example, for piezoelectric layers made of PZT and associated electrode layers as the residual stress is determined by the annealing for crystallization imposed by PZT and similarly for the TiN thermal compensation layer.

In order to fabricate a stress balanced device structure with zero or predetermined deflection, the stress of the main mechanical layer, silicon or silicon nitride/oxide in the example described herein, can be adjusted. For example, with a silicon mechanical layer, the stress of the mechanical layer can be controlled by the deposition/anneal temperature and with a silicon nitride mechanical layer, the stress can be controlled by the deposition condition.

Starting from the publication of Hsuch, it is possible to generalize Equation 2 to take account of stress and thermal effect and to arrive at the following equation.

$$\delta = \frac{-6 \cdot L^2 \cdot \sum_i \sum_{j>i} d_{ij} \cdot E_i \cdot E_j \cdot t_i \cdot t_j (S_j - S_i) \cdot z_{ij}}{\sum_i E_i^2 \cdot t_i^4 + \sum_i \sum_{j>i} E_i \cdot E_j \cdot t_i \cdot t_j \cdot (12 d_{ij}^2 + t_i^2 + t_j^2)} \quad \text{Equation 10}$$

$$\text{where } S_i = \alpha_i \cdot \Delta T - \frac{\sigma_i}{E_i}$$

where:

σi is the residual stress in layer i.

The component of the deflection proportional to temperature variation results in equation 3a as described before. The constant term (with respect to temperature variation) is by definition the deflection due to residual stress, δR:

$$\delta_R = \frac{6 \cdot L^2 \cdot \sum_i \sum_{j>i} d_{ij} \cdot E_i \cdot E_j \cdot t_i \cdot t_j \left(\frac{\sigma_j}{E_j} - \frac{\sigma_i}{E_i}\right) \cdot z_{ij}}{\sum_i E_i^2 \cdot t_i^4 + \sum_i \sum_{j>i} E_i \cdot E_j \cdot t_i \cdot t_j \cdot (12 d_{ij}^2 + t_i^2 + t_j^2)} \quad \text{Equation 11a}$$

To achieve zero initial deflection, the following condition may apply:

$$m_\sigma = \sum_i \sum_{j>i} d_{ij} \cdot E_i \cdot E_j \cdot t_i \cdot t_j \left(\frac{\sigma_j}{E_j} - \frac{\sigma_i}{E_i}\right) \cdot z_{ij} = 0 \quad \text{Equation 11b}$$

$$m_\sigma = 0$$

The deflection described by equation 11a is due to a residual stress bending moment acting on the beam which is proportional to the value of $m_\sigma$ given by Equation 11b. When $m_\sigma = 0$, there is no bending moment and so there is no deflection.

For simplification, the following description, starting from equation 11b, is aimed to achieve a stress balance or compensation which results in a zero residual deflection of the movable structure (e.g on release and when the device is in an inactive or not actuated state). As discussed above, the residual deflection amount may be non-zero depending on the application. It will be appreciated that the same methods of analysis can be applied to determine the requirements for stress adjustment which results in a non-zero deflection.

Although the disclosure describes reducing the thermal effect for a beam structure having a free end (as shown in FIG. 2), it will be appreciated that the disclosure may also be applied to other structures sensitive to a bending moment, such as the clamped structures shown in FIGS. 14 and 15, where the bending moment may also be proportional to $m_\sigma$ given by Equation 11b.

As an explanation as to why the adjustment of stress in the mechanical layer is sometimes an issue when trying to adjust the residual deflection, the same assumptions can be made on the thicknesses of the layer as above (mechanical layer bigger than the other layers—thin layer case) which leads to a set of two equations: Equation 6b for the thermal effect and Equation 12 for the stress effect.

$$\sum_{i \neq 0} \cdot E_i \cdot \bar{t}_i \cdot \left(\frac{\sigma_0}{E_0} - \frac{\sigma_i}{E_i}\right) = 0 \quad \text{Equation 12}$$

The choice of material for the thermal compensation layer 206 can lead to a thermal compensation layer with a CTE close to the main CTE of the actuating layers 202 (as defined by equation 4). This is the case when the temperature compensation layer and actuating layers are of the same material but will also be the case for, for example, a PZT stack with Pt electrodes and a thermal compensation layer formed from titanium nitride, since PZT has a lower Young's modulus compared to TiN and Pt and TiN have similar CTEs.

If the CTEs of the thermal compensation layer 206 and actuating layers 202 are close, the thermal balance of the movable structure starting from equation 6b leads to:

$$\sum_{i \neq 0} \cdot E_i \cdot \bar{t}_i \approx 0 \quad \text{Equation 13}$$

At the same time, the stress balance starting from Equation 8b is defined by:

$$\frac{\sigma_0}{E_0} = \frac{\sum_{i \neq 0} \bar{t}_i \cdot \sigma_i}{\sum_{i \neq 0} \cdot E_i \cdot \bar{t}_i} \quad \text{Equation 14}$$

If $$\sum_{i \neq 0} \cdot E_i \cdot \bar{t}_i = 0$$

then equation 14 because of equation 13 is met for all the value of residual stress in the mechanical layer (which was called the "naturally balanced" case) and the device structure is balanced. However, generally this is not the case and because of equation 13, the stress level needed in the mechanical layer to balance the stress can be too big to be achievable.

In an example, a discrete stress gradient (or more generally a stress gradient) is added in the mechanical layer 204 by means of a stress compensation layer 207 which may be formed adjacent the mechanical layer 207 and of a material which has substantially the same thermal response characteristic as the mechanical layer. For example, the stress compensation layer 207 is formed of a material having the same CTE as the mechanical layer 204 or of a material with a CTE substantially close or similar to the CTE of the material of the mechanical layer and with a low Young's Modulus (when compared to other layers).

When a stress compensation layer with number k is added to the beam 204 (with number 0), the conditions to limit the thermal effect of this new layer may be given by (for all other i layers):

$$E_k(\alpha_0 - \alpha_k) \ll E_i(\alpha_0 - \alpha_i) \quad \text{Equation 15}$$

In an example MEMS device having a mechanical layer formed from SiN, negligible impact on the thermal behaviour of the device can be achieved by using, for example, two layers of SiN but with different levels of stress by adjusting the film stoichiometry (with the CTE substantially the same): the mechanical layer 204 is formed of SiN at one Si—N ratio and the stress compensation layer 207 is formed of SiN at another Si—N ratio. In another example, negligible impact on the thermal behaviours of the device may instead be achieved by using a silicon dioxide layer as the stress compensation layer 207 adjacent a SiN or Si poly mechanical layer 204. In this latter case, the silicon dioxide has a CTE close to that of SiN or Si poly and a low Young's modulus.

A first way to simplify Equations 11a and 11b is to make an assumption that the thickness of the layer called the "mechanical layer" (layer number 0) is large compared to the total thickness of all the layers which are above and below it. In this case, the value of the stress gradient provided across the mechanical layer 204 in a vertical direction and stress compensation layer 207 (layer number k) is determined by the thicknesses of the mechanical and stress compensation layers and the difference of stress values between these two layers is provided by the following equation:

$$E_k \cdot h_k \left(\frac{\sigma_0}{E_0} - \frac{\sigma_k}{E_k}\right) = \sum_{i \neq 0, i \neq k} h_i \cdot \sigma_i - \sum_{i \neq 0, i \neq k} h_i \cdot E_i \quad \text{Equation 16}$$

A second way to simplify equations 11a and 11b is to make the assumption that the thickness of the layer called "the stress compensation layer 207" is small at least when compared to some of the other layers. The result is the same as the one described by equations 4 and 5 where $\alpha_i$ is replace by $-\sigma_i/E_i$ with equation 4 giving equations 17a for residual deflection and equation 5 giving equation 17b for thickness. The same conditions apply to equation 17b and the stress compensation layer can be moved from top to bottom to find a positive solution for the thickness.

$$\delta_R = \quad \text{Equation 17a}$$

$$6 \cdot L^2 \cdot \frac{\left[\sum\limits_{i \neq N}\sum\limits_{N>j>i} d^*_{ij} \cdot E_i \cdot E_j \cdot t_i \cdot t_j \left(\frac{\sigma_j}{E_j} - \frac{\sigma_i}{E_i}\right) \cdot z_{ij} + t_N \cdot \sum\limits_{i \neq N} d^*_{iN} \cdot E_i \cdot E_N \cdot t_i \left(\frac{\sigma_N}{E_N} - \frac{\sigma_i}{E_i}\right) \cdot z_{iN}\right]}{\sum\limits_{i \neq N} E_i^2 \cdot t_i^4 + \sum\limits_{i \neq N}\sum\limits_{N>j>i} E_i \cdot E_j \cdot t_i \cdot t_j \cdot (12 d^{*2}_{ij} + t_i^2 + t_j^2)} \Delta T_0$$

-continued $$t_N = \frac{-\sum\limits_{i \neq N}\sum\limits_{N>j>i} d^*_{ij} \cdot E_i \cdot E_j \cdot t_i \cdot t_j \left(\frac{\sigma_j}{E_j} - \frac{\sigma_i}{E_i}\right) \cdot z_{ij}}{\sum\limits_{i \neq N} d^*_{iN} \cdot E_i \cdot E_N \cdot t_i \cdot \left(\frac{\sigma_N}{E_N} - \frac{\sigma_i}{E_i}\right) \cdot z_{iN}} \quad \text{Equation 17b}$$

A third way to simplify equations 11a and 11b is to assume that the mechanical layer and stress compensation layer have the same Young modulus and are on top of each other which is the case when the same material for both layers is used, such as when SiN is used with stress controlled by Si doping.

This gives equations 18a and 18b $$\delta_R = \frac{3 \cdot L^2}{E_0 \cdot t_0^3} \cdot \left[\sum_{i \neq 0} E_i \cdot t_i \left(\frac{\sigma_i}{E_i} - \frac{\sigma_0}{E_0}\right) \cdot z_{0i} + \frac{\delta\sigma}{E_0}\left(E_0 \cdot t_0 r(1-r) + \sum_{i \neq 0} E_i \cdot t_i \cdot T_i\right)\right] \quad \text{Equation 18a}$$

$$\frac{\delta\sigma}{E_0} = \frac{-\sum\limits_{i \neq 0} E_i \cdot t_i \left(\frac{\sigma_i}{E_i} - \frac{\sigma_0}{E_0}\right) \cdot z_{0i}}{E_0 \cdot t_0 r(1-r) + \sum\limits_{i \neq 0} E_i \cdot t_i \cdot T_i} \quad \text{Equation 18b}$$

Where:

when comparing the mechanical layer and the stress compensation layer, the one which is on the bottom of the other has a thickness r×t0 and a stress σ0−δσ/2 and the other has a thickness (1−r)×t0 and a stress σ0+δσ/2

E0 is the Young modulus of these two layers;

z0i is defined by previous convention by comparing the position of layer i to the stress or mechanical layer; and Ti=2r·(1−r)+z0i×(2r−1).

Equation 18b gives the value of the difference of stress in the two layers as a function of their thickness. Equation 18b has always a mathematical solution and the difference of thickness r can be used to find a solution which can be implemented with the selected materials.

As for temperature compensation, when a solution for the stress compensation has been found, equations 17a can be put in the general form $$\delta_R = a_R \cdot t_N - \delta_{R,0} \quad \text{Equation 19}$$

where δR,0 and aR are independent of the value of $t_N$ and have the same sign (because the ratio is the thickness for the stress compensation layer) and may be represented by:

$$\delta_{R,0} = \frac{6 \cdot L^2 \cdot \left[\sum\limits_{i \neq N}\sum\limits_{N>j>i} d^*_{ij} \cdot E_i \cdot E_j \cdot t_i \cdot t_j \left(\frac{\sigma_j}{E_j} - \frac{\sigma_i}{E_i}\right) \cdot z_{ij}\right]}{\sum\limits_{i \neq N} E_i^2 \cdot t_i^4 + \sum\limits_{i \neq N}\sum\limits_{N>j>i} E_i \cdot E_j \cdot t_i \cdot t_j \cdot (12 d^{*2}_{ij} + t_i^2 + t_j^2)}$$

$$a_R = \frac{6 \cdot L^2 \cdot \left[\sum\limits_{i \neq N} d^*_{iN} \cdot E_i \cdot E_N \cdot t_i \left(\frac{\sigma_j}{E_j} - \frac{\sigma_i}{E_i}\right) \cdot z_{iN}\right]}{\sum\limits_{i \neq N} E_i^2 \cdot t_i^4 + \sum\limits_{i \neq N}\sum\limits_{N>j>i} E_i \cdot E_j \cdot t_i \cdot t_j \cdot (12 d^{*2}_{ij} + t_i^2 + t_j^2)}$$

In this case, as for thermal compensation, for a maximum residual deflection lower than a given value of δm, the range of possible thicknesses for the stress compensation layer is;

$$\frac{\delta_{R0}}{a_R} - \frac{\delta_{Rm}}{|a_R|} < t_N < \frac{\delta_{R0}}{a_R} + \frac{\delta_{Rm}}{|a_R|} \quad \text{Equation 20}$$

where $\delta Rm$ is the uncertainty of initial deflection acceptable for the application.

Equation 18a can be put in the form $$\delta_R = a_\sigma \cdot \delta\sigma - \delta_{\sigma,0} \quad \text{Equation 21}$$

And then an equation 22 similar to equation 20 can be derived.

$$\frac{\delta_{\sigma 0}}{a_\sigma} - \frac{\delta_{Rm}}{|a_R|} < \frac{\delta\sigma}{E_0} < \frac{\delta_{\sigma 0}}{a_\sigma} + \frac{\delta_{Rm}}{|a_\sigma|} \quad \text{Equation 22}$$

$$\delta_{\sigma 0} = \frac{3 \cdot L^2}{E_0 \cdot t_0^3} \cdot \left[ \sum_{i \neq 0} E_i \cdot t_i \left( \frac{\sigma_i}{E_i} - \frac{\sigma_0}{E_0} \right) \cdot z_{0i} \right]$$

$$a_R = \frac{3 \cdot L^2}{E_0 \cdot t_0^3} \cdot \left[ \left( E_0 \cdot t_0 r(1-r) + \sum_{i \neq 0} E_i \cdot t_i \cdot T_i \right) \right]$$

As for thermal compensation and $\delta m$, $\delta Rm$ is defined by the specification of the application. In general, for an actuator defined by its maximum deflection variation $\delta a$ between ON and OFF state at room temperature, $\delta Rm$ for residual stress can be defined as a fraction of $\delta a$, for example 20%.

The same calculation can be applied when the targeted deflection is not zero. Equation 20 is replaced by Equation 23 and Equation 21 by equation 24

$$\frac{\delta_R^*}{|a_R|} + \frac{\delta_{R0}}{a_R} - \frac{\delta_{Rm}}{|a_R|} < t_N < \frac{\delta_R^*}{|a_R|} + \frac{\delta_{R0}}{a_R} + \frac{\delta_{Rm}}{|a_R|} \quad \text{Equation 23}$$

$$\frac{\delta_R^*}{|a_\sigma|} + \frac{\delta_{\sigma 0}}{a_\sigma} - \frac{\delta_{Rm}}{|a_R|} < \frac{\delta\sigma}{E_0} < \frac{\delta_R^*}{|a_\sigma|} + \frac{\delta_{\sigma 0}}{a_\sigma} + \frac{\delta_{Rm}}{|a_\sigma|} \quad \text{Equation 24}$$

where $\delta R^*$ is the targeted deflection

Thus, in an example described herein, once the structure of the thermal compensation layer 206 is determined, the structure of the stress compensation layer 207 is determined. In the case of a stress compensation layer 207 comprising a single layer, this determination involves, for example, selecting the material of the stress compensation layer 207 from a list of materials which are compatible with the material of the mechanical layer 204.

It will be appreciated that equation 11b provides the targeted thickness and stress values for the stress compensation layer 207 in the case when the resulting deflection of the movable structure 203 is to be substantially zero. In order to provide non-zero deflection, the deflection can be calculated by generalising with equation 11a for given characteristics of the compensation layer 207 to a predetermined range of deflection values.

In an example, the stress compensation provided by the compensation layer(s) may be designed so that the ratio between the bending moment due to residual stress $m_\sigma$ (see equation 11b) and the bending moment due to actuation $m_A$ (defined by equation 3b) is small enough to avoid stress actuation when compared to the regular actuation (e.g. due to applying a voltage to a piezoelectric actuating layer). For example, the material and thicknesses of the layers may be chosen so that $m_\sigma/m_A$ is less than 50%. In other words, in an example embodiment, a range for the thickness of the compensation layer can be obtained by solving equation 11b and then by using the condition on the ratio between $m_\sigma$ and $m_A$ given above or some percentage (say 10%) of the solution to equation 11b.

As for thermal compensation, the range of deflection values can be defined by the maximum deflection fluctuation $\delta m$.

It will be appreciated in an example device having first and second compensation layers which together compensate for stress and thermal effects rather than having a thermal compensation layer for thermal effects and a stress compensation layer for stress effects, the first and second compensation layers may be chosen according to equations 4b and 8b to provide at the same time thermal and stress compensation or according to equations 4a and 4b to control the deflection within a predetermined range (near zero or not) for a given value of stress in the other layers.

In the example shown in FIG. 2, the actuating layers 202 extends a length 218 across the beam 204 and the thermal compensation layer 206 extends substantially the same length 218 across the beam 204 such that the actuating layers 202, and the thermal compensation layer 206 have substantially the same coverage areas in a plane substantially parallel to the beam 204. By having the same coverage areas across the beam 204, it may be ensured that the moment caused by the thermal effect all along the length of the beam is cancelled or at least reduced.

In an example, the actuating layers 202 may comprise at least one piezoelectric capacitor including a piezoelectric layer 212 formed between first 214 and second 216 electrodes. The actuating layers 202 may alternatively include a plurality of piezoelectric capacitors stacked as in the arrangement disclosed in US patent application publication no. 2005/0127792 incorporated herein by reference. In an example, the piezoelectric layer 212 may be formed from PZT material and thus comprises a PZT layer 212 and the first 214 and second 216 electrodes are platinum electrodes. With the actuating layers 202 comprising Pt/PZT/Pt layers, the thermal compensation layer 206 may comprise a platinum layer, a titanium nitride layer, tungsten silicon layer, titanium tungsten layer, titanium, tungsten nitride layer, tungsten nitride layer or other layer of similar material or one or two layers of any combinations of these materials in order for the CTE of the thermal compensation layer 206 to thermally compensate for the actuating layers 202. For the example having a titanium nitride thermal compensation layer 206, the titanium nitride thermal compensation layer 206 has a CTE of approximately 8-9 ppm/° C., the Pt/PZT/PT actuating layers have a CTE of 9.5 ppm/° C. and the beam 204 being formed of silicon oxide has a CTE of 2-3 ppm/° C. and thus, thermal balance can be achieved.

The stress compensation layer 207 may comprise a silicon dioxide layer or a silicon nitride layer or a silicon oxide-nitride-oxide layer or other similar materials for example when the beam 204 is a silicon nitride beam or other type of silicon beam. In the case of a silicon nitride stress compensation layer 207 formed with a silicon nitride beam 204, the stresses of the silicon nitride stress compensation layer 207 is arranged to be different to the silicon nitride beam 204 in order to achieve stress balance by having different deposition process recipes between the stress compensation layer 207 and the beam 204. The material and stress of the stress compensation layer 207 is chosen so as to ensure a stress gradient across the layers of the MEMS transducer device so as to provide vertical stress balance whilst having negligible impact on the thermal balance of the device.

Figure 4:
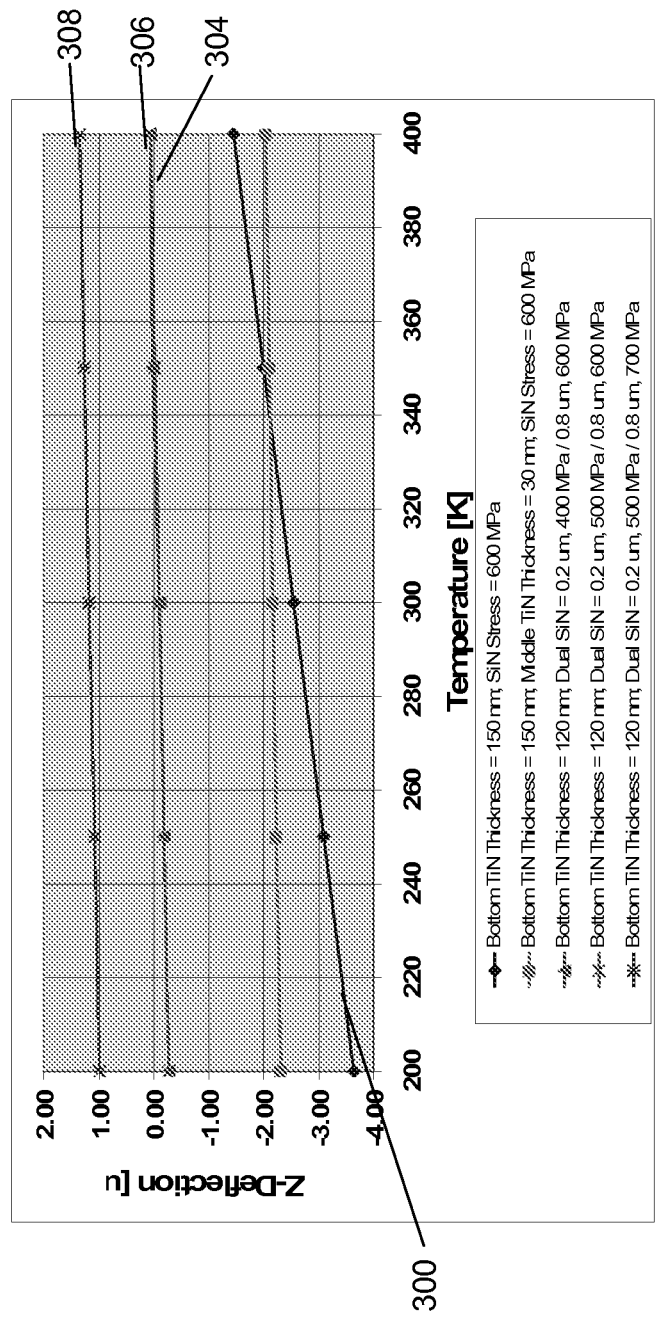
FIG. 4 is a graphical representation of the variation in the deflection of a PZT actuated beam as shown in FIG. 2 at different operating temperatures with different stress compensation layers.

FIG. 4 is a graph showing the variation in the deflection of a PZT actuated beam as shown in FIG. 2 at different operating temperatures for different stress compensation layers 207 and with a titanium nitride thermal compensation layer 206 and a silicon nitride beam 204. Curve 300 represents the variation in deflection with changes in temperature for a titanium nitride thermal compensation layer 206 having a thickness of 150 nm and a silicon nitride beam 204 having a residual stress of 600 MPa (i.e. this structure does not have a stress compensation layer 207). Curve 304 represents the variation in deflection with changes in temperature for a titanium nitride thermal compensation layer 206 having a thickness of 120 nm, a silicon nitride stress compensation layer 207 having a thickness of 0.2 μm and residual stress of 400 MPa and a silicon nitride beam 204 having a thickness of 0.8 μm a residual stress of 600 MPa. Curve 306 represents the variation in deflection with changes in temperature for a titanium nitride thermal compensation layer 206 having a thickness of 120 nm, a silicon nitride stress compensation layer 207 having a thickness of 0.2 μm and residual stress of 500 MPa and a silicon nitride beam 204 having a thickness of 0.8 μm a residual stress of 600 MPa. Curve 308 represents the variation in deflection with changes in temperature for a titanium nitride thermal compensation layer 206 having a thickness of 120 nm, a silicon nitride stress compensation layer 207 having a thickness of 0.2 μm and residual stress of 500 MPa and a silicon nitride beam 204 having a thickness of 0.8 μm a residual stress of 700 MPa. As can be seen from the graph, by using a silicon nitride stress compensation layer 207 to adjust the stress balance of the structure, the deflection of the beam 204 over temperature remains substantially flat and the value of the deflection can be adjusted by the stress of the stress compensation layer 207.

For a clamped structure, such as that shown in FIG. 14 or 15, the average value of the stress induces a change in the elasticity of the structure. This is a second order effect on the deflection when compared to the effect of the stress gradient due to the different layers of the multilayered structure and thermal effects, especially if the mechanical structure has a CTE close to the substrate (which is the case when the substrate is a silicon substrate and the beam is formed of silicon nitride).

An example of a method of forming an electromechanical transducer device in accordance with an embodiment of the present disclosure will now be described with further reference to FIGS. 2-9 in which only part of the transducer device is shown, for simplicity.

As shown in FIG. 5, a semiconductor substrate 400 is provided and a sacrificial layer 402 is formed over the semiconductor substrate 400. The semiconductor substrate described herein can be any semiconductor material or combinations of materials, such as gallium nitride, silicon carbide, silicon-on-insulator (SOI), silicon, monocrystalline silicon, the like, and combinations of the above. The sacrificial layer 402 is, for example, a 1 μm thick amorphous silicon layer which may be deposited using Plasma Enhanced Chemical Vapor Deposition PECVD. The thickness of the sacrificial layer 402 determines the height of the air gap between the thermal compensation layer 206 (of FIG. 2) and the substrate 400 (210 of FIG. 2). The sacrificial layer 402 may be formed from other materials such as silicon, polysilicon, silicon dioxide.

A layer 405 is then deposited over the sacrificial layer 402 as shown in FIG. 6. Layer 405, once patterned and etched, forms the thermal compensation layer 206. In an embodiment, a layer 411 is then formed over the layer 405. Layer 411, once patterned and etched, forms the stress compensation layer 207. Layers 405 and 411 are then patterned and etched to form the thermal compensation layer 206 and stress compensation layer 207 (of FIG. 2). In an example method, the layers 405 and 411 can be etched using a single mask. This enables the thermal compensation layer 206 and the stress compensation layer 207 to be formed using a single mask which reduces process steps and cost and also ensures that the stress compensation layer 207 has the same coverage area as the thermal compensation layer 206 which helps to achieve stress and thermal balance.

In the example shown, the layer 405 is a single layer of titanium nitride deposited by Physical Vapor Deposition (PVD) which forms a single layer thermal compensation layer 206 having a thickness of 10 nm-300 nm. Other materials which may be used for the thermal compensation layer 206 include platinum, titanium nitride, tungsten silicon, titanium tungsten, titanium, tungsten nitride, tungsten nitride or other similar materials or any combinations thereof. In the case of the thermal compensation layer 206 comprising more than one layer, then the other layers would be deposited, patterned and etched at this stage. The number of layers and the type of material(s) used for the one or more layers and the thickness of the layers are selected according to the desired thermal effect which compensates or balances the thermal effect of the beam 204 and the actuating layers 202 and thus, may be selected depending on the thickness and the thermal response characteristic of each of the beam 204 and the actuating layers 202 as described above.

In the example shown, the layer 411 is a single layer of silicon nitride deposited by PECVD which forms a single layer stress compensation layer 207 having a thickness of 0.1 μm-0.5 μm. Other materials which may be used for the stress compensation layer 207 include silicon oxide, silicon oxidenitride or any combinations thereof. The number of layers and the type of material(s) used for the one or more layers and the thickness of the layers are selected according to the desired stress effect which compensates or balances the stress effect of the beam 204 and the actuating layers 202 and thus, depends on the thickness and the stress response characteristic of each of the beam 204 and the actuating layers 202 as described above.

Figure 8:
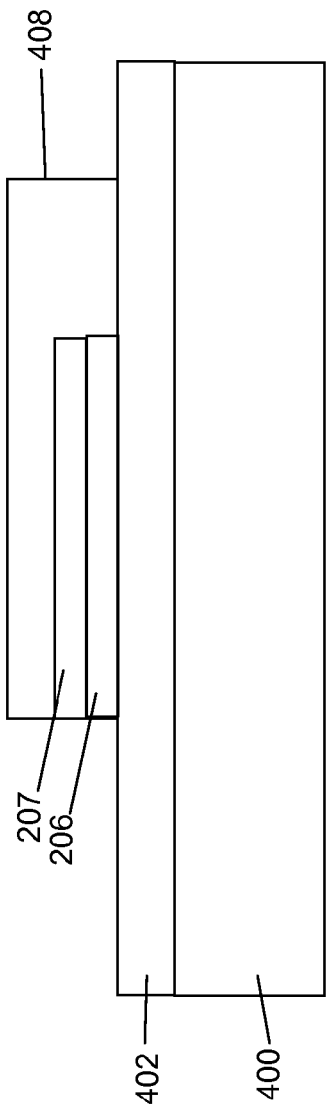

A layer 408 is then deposited over the sacrificial layer 402, and the stress compensation layer 207, FIG. 8. The layer 408 is then patterned and etched to form the beam 204 which will provide support and mechanical strength to the final released structure. In an embodiment, the layer 408 is a silicon nitride layer which is deposited using Low Pressure Vapor Deposition (LPCVD). However, other materials may be used instead for layer 408 such as silicon dioxide or silicon oxide-nitride or similar dielectric materials. The layer 408 can be patterned at this stage or later depending on the etch method used for the piezoelectric layer 212 of FIG. 9. For example, should the piezoelectric layer 212 of FIG. 9 be etched through a dry etch process, the layer 408 can be patterned at this stage. Should the piezoelectric layer 212 of FIG. 9 be etched by means of a wet etch process, the layer 408 is patterned at a later stage so that it may serve to protect the underlying sacrificial layer 402 from the etching chemicals.

Figure 9:
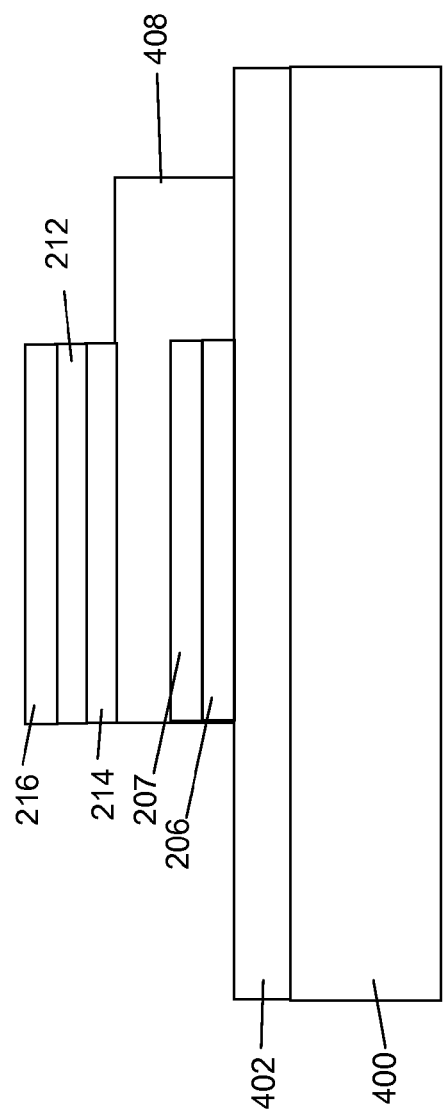

As shown in FIG. 9, the first electrode 214 is then formed on the layer 408. For example, the first electrode 214 is formed using sputter deposition and a lift-off process which is well known in the art. In an embodiment, the first electrode 214 is a platinum electrode having a thickness of 50 nm-500 nm. In another embodiment, the first electrode 214 may be formed from ruthenium oxide, iridium, iridium oxide, ruthenium, ruthenium dioxide, gold, copper or other suitable metal.

A piezoelectric layer 212 is then formed over the first electrode 214. The piezoelectric layer 212 is, for example, formed from a PZT layer having a thickness of 50 nm to 3 μm, deposited using, for example, a sol-gel deposition process and then patterned and etched using a variety of dry or wet etch techniques. Alternative materials for the piezoelectric layer 212 include zinc oxide, aluminium nitride, PLZT, PMNT or similar materials.

The second electrode 216 is then formed on the layer piezoelectric layer 212. For example, the second electrode 216 is formed using sputter deposition and a lift-off process which is well known in the art. In an embodiment, the second electrode 216 is also a platinum electrode having a thickness of 50 nm-500 nm. In another embodiment, the second electrode 214 may be formed from ruthenium oxide, iridium, iridium oxide, ruthenium, ruthenium dioxide, gold, copper or other suitable metal. The second electrode 216 may be formed from the same metal or a different metal as the first electrode 214. Having electrodes formed from the same metal makes the overall process simpler.

The thermal compensation layer 206 and the Pt/PZT/Pt layers 202 are arranged to have the same coverage areas over the surfaces of the beam 204. Photolithography may be used to align the different layers.

Although not shown, additional piezoelectric layers may then be formed so as to provide a structure having several stacked piezoelectric capacitors.

It will be appreciated that, although not shown and described, at least one anchor 208 will be formed during the formation of the MEMS switch device 200 to support the movable structure 203 on the substrate 210.

The manufacturing of the MEMS transducer device may then be continued according to standard processes. This may include, for example, performing an anneal step and forming the last metal layer. Furthermore, the sacrificial layer 402 is then removed by using chemical release methods known in the art, for example by means of hydrofluoric acid so as to provide the structure as shown in FIG. 2.

As discussed above, for simplicity the manufacture of only part of a transducer device has been described. It would be clear to a person skilled in the art how to form other elements of the device such as the switch contact pads, anchor 208.

In summary, the transducer device, for example as described with reference to FIG. 2, uses a thermal compensation layer to balance or compensate the thermal effect of the movable structure including the at least one actuating layer and the beam so as to provide a device that is thermally stable over a wide temperature range and a stress compensation layer to adjust or compensate the stress effect of at least the beam and the actuating layer. The stress compensation layer generates a stress gradient to compensate for the stress gradient that was created by the other functional layers of the transducer device in order to realise a structure with controlled beam deflection. By using two compensation layers, such as the stress compensation layer and the thermal compensation layer shown in FIG. 2, more independent control of the stress and thermal balance can be achieved compared to the known methods of balancing stress which adjust the deposition process parameters. This allows for a wider selection of compensation materials for the different compensation layers. Furthermore, by using a thermal compensation layer which is different to the at least one actuating layer, for example comprising one or two layers only, or formed of a different material which is compatible with the process, the MEMS transducer device in accordance with the disclosure does not need to use a compensating structure which is symmetrical with the actuating structure and thus, thermal stability can be achieved without a significant increase in cost or process complexity. In the case of piezoelectric actuated devices, very complex symmetrical compensation structures can be avoided which means that thermal balance can be achieved with the number of processing steps and variations due to manufacturing process variations reduced significantly compared to a symmetric compensation structure. Also, any contamination issues due to forming the compensation structure before the mechanical layer deposition can be avoided.

In an example, the thermal response characteristic of the stress compensation layer is arranged to be the same as the beam so that the stress compensation layer has negligible impact on the thermal balance provided by the thermal compensation layer.

In the above, the invention has been described with reference to a cantilevered beam structure. It will however be appreciated that the thermal compensation layer as described above can be applied to other beam arrangements (e.g. doubly supported beams) or plates or similar arrangements with at least one free end or at least one unsupported end or clamped structures (with supported or clamped ends) and is not limited to cantilevered beam structures. More generally, the thermal compensation structure as described above can be applied to devices that are designed to be actuated by using the generation of stress in a layer to induce a bending moment.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. A micro or nano electromechanical transducer device formed on a semiconductor substrate comprising:
    a movable structure being arranged to be movable in response to actuation of an actuating structure and comprising:
        a mechanical structure having at least one mechanical layer having a first thermal response characteristic and a first mechanical stress response characteristic;
        at least one layer of the actuating structure, the at least one layer having a second thermal response characteristic different to the first thermal response characteristic and a second mechanical stress response characteristic different to the first mechanical stress response characteristic;
        a first compensation layer having a third thermal response characteristic and a third mechanical stress response characteristic; and
        a second compensation layer having a fourth thermal response characteristic and a fourth mechanical stress response characteristic,
    wherein the first and second compensation layers are arranged to compensate a thermal effect produced by the different first and second thermal response characteristics of the mechanical structure and the at least one layer of the actuating structure such that movement of the movable structure is substantially independent of variations in temperature and to adjust a stress effect produced by the different first and second stress response characteristics of the mechanical structure and the at least one layer of the actuating structure such that the movable structure is deflected a predetermined amount relative to the substrate when the electromechanical transducer device is in an inactive state.

2. The micro or nano electromechanical transducer device of claim 1, wherein the movable structure is formed over a surface of the semiconductor substrate and the predetermined amount includes a predetermined range of deflection values relative to a plane parallel to the surface of the semiconductor substrate.

3. The micro or nano electromechanical transducer device of claim 1, wherein the predetermined amount includes zero deflection.

4. The micro or nano electromechanical transducer device of claim 1, wherein the first compensation layer is a thermal compensation layer and the second compensation layer is a stress compensation layer, wherein the thermal compensation layer is arranged to compensate the thermal effect and the stress compensation layer is arranged to compensate the stress effect.

5. The micro or nano electromechanical transducer device of claim 4, wherein the stress compensation layer is arranged to have a fourth thermal response characteristic which is substantially the same as the first thermal response characteristic.

6. The micro or nano electromechanical transducer device of claim 4, wherein the stress compensation layer is adjacent the mechanical structure.

7. The micro or nano electromechanical transducer device of claim 4, wherein the mechanical structure and the stress compensation layer are formed from the same type of material with different levels of stress.

8. The micro or nano electromechanical transducer device of claim 4, wherein the thermal compensation layer is different to the at least one layer of the actuating structure.

9. The micro or nano electromechanical transducer device of claim 4, wherein the thermal compensation layer is adjacent the mechanical structure on a side of the mechanical structure opposite to the stress compensation layer.

10. The micro or nano electromechanical transducer device of claim 4, wherein the at least one layer of the actuating structure is formed of a first material and the thermal compensation layer is formed of a second material different to the first material.

11. The micro or nano electromechanical transducer device of claim 4, wherein the thermal compensation layer and the at least one layer of the actuating structure forming part of the movable structure are formed on opposite sides of the mechanical structure.

12. The micro or nano electromechanical transducer device of claim 1, wherein the actuating structure includes a plurality of layers and the plurality of layers form part of the movable structure, the movable structure being movable in response to actuation of the plurality of layers.

13. The micro or nano electromechanical transducer device of claim 12, wherein the plurality of layers includes a piezoelectric layer formed between first and second electrode layers.

14. The micro or nano electromechanical transducer device of claim 12, wherein the actuating structure further comprises a layer formed on the semiconductor substrate.

15. The micro or nano electromechanical transducer device of claim 1, wherein the at least one layer of the actuating structure forming part of the movable structure occupies a first area in a plane substantially parallel to the mechanical structure and wherein the first and second compensation layers occupy a second area in a plane substantially parallel to the mechanical structure, wherein the second area is substantially the same as the first area.

16. The micro or nano electromechanical transducer device of claim 1, wherein the first and second compensation layers are formed from materials selected according to the Coefficient of Thermal Expansion and Young's modulus of the materials, and wherein each of the first and second compensation layers has a predetermined thickness in order to compensate the thermal and stress effects.

17. The micro or nano electromechanical transducer device of claim 16, wherein the first compensation layer is a thermal compensation layer and the second compensation layer is a stress compensation layer, wherein the predetermined thickness of the thermal compensation layer is obtained by solving the following equation:

$$\sum_i \sum_{j>i} d_{ij} \cdot E_i \cdot E_j \cdot t_i \cdot t_j (\alpha_i - \alpha_j) \cdot z_{ij} \cdot \Delta T_0 = 0,$$

and wherein the predetermined thickness of the stress compensation layer is obtained by solving the following equation:

$$\sum_i \sum_{j>i} d_{ij} \cdot E_i \cdot E_j \cdot t_i \cdot t_j \left(\frac{\sigma_j}{E_j} - \frac{\sigma_i}{E_i}\right) \cdot z_{ij} = 0$$

Where:
 $E_i$ is the Young's modulus of layer i;
 $t_i$ is the thickness of layer i;
 $\alpha_i$ is the CTE of layer i;
 $d_{ij}$ is the distance between layers i and j, measured from the middle of the layers;
 $\sigma_i$ is the residual stress in layer i; and
 $z_{ij}$ is equal to 1 when layer j is above layer i and equals to −1 when layer j is below layer i.

18. A method of forming a micro or nano electromechanical transducer device on a semiconductor substrate, the micro or nano electromechanical transducer device comprising a movable structure being arranged to be movable in response to actuation of an actuating structure, the method comprising forming the movable structure by:
 providing a mechanical structure comprising at least one mechanical layer having a first thermal response characteristic and a first mechanical stress response characteristic;
 providing at least one layer of the actuating structure, the at least one layer having a second thermal response characteristic different to the first thermal response characteristic and a second mechanical stress response characteristic different to the first mechanical stress response characteristic;
 providing a first compensation layer having a third thermal response characteristic and a third mechanical stress characteristic,
 providing a second compensation layer having a fourth thermal response characteristic and a fourth mechanical stress response characteristic,
 wherein the first and second compensation layers are arranged to compensate a thermal effect produced by the different first and second thermal response characteristics of the mechanical structure and the at least one layer of the actuating structure such that movement of the movable structure is substantially independent of variations in temperature and to adjust a stress effect produced by the different first and second stress response characteristics of the mechanical structure and the at least one layer of the actuating structure such that the movable structure is deflected a predetermined amount relative to the substrate when the electromechanical transducer device is in an inactive state.

19. The method of claim 18, wherein the movable structure is formed over a surface of the semiconductor substrate and the predetermined amount includes a predetermined range of deflection values relative to a plane parallel to the surface of the semiconductor substrate.

20. The method of claim 18, wherein the predetermined amount includes zero deflection.

21. The method of claim 18, wherein the first compensation layer is a thermal compensation layer and the second compensation layer is a stress compensation layer, wherein the thermal compensation layer is arranged to compensate the thermal effect and the stress compensation layer is arranged to compensate the stress effect.

22. The method of claim 21, further comprising selecting materials for the thermal compensation layer and the stress compensation layer according to the Coefficient of Thermal Expansion and Young's modulus of the materials, and arranging for each of the temperature and stress compensation layers to have predetermined thicknesses in order to compensate the thermal and stress effects.

23. The method of claim 22, wherein the predetermined thickness of the thermal compensation layer is obtained by solving the following equation:

$$\sum_i \sum_{j>i} d_{ij} \cdot E_i \cdot E_j \cdot t_i \cdot t_j (\alpha_i - \alpha_j) \cdot z_{ij} \cdot \Delta T_0 = 0,$$

and wherein the predetermined thickness of the stress compensation layer is obtained by solving the following equation:

$$\sum_i \sum_{j>i} d_{ij} \cdot E_i \cdot E_j \cdot t_i \cdot t_j \left( \frac{\sigma_j}{E_j} - \frac{\sigma_i}{E_i} \right) \cdot z_{ij} = 0$$

Where:
- $E_i$ is the Young's modulus of layer i;
- $t_i$ is the thickness of layer i;
- $\alpha_i$ is the CTE of layer i;
- $d_{ij}$ is the distance between layers i and j, measured from the middle of the layers;
- $\sigma_i$ is the residual stress in layer i; and
- $z_{ij}$ is equal to 1 when layer j is above layer i and equals to −1 when layer j is below layer i.

* * * * *